(12) United States Patent
Sakurai et al.

(10) Patent No.: US 7,274,617 B2
(45) Date of Patent: Sep. 25, 2007

(54) NON-VOLATILE SEMICONDUCTOR MEMORY

(75) Inventors: Kiyofumi Sakurai, Yokohama (JP); Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 11/283,853

(22) Filed: Nov. 22, 2005

(65) Prior Publication Data

US 2006/0133139 A1    Jun. 22, 2006

(30) Foreign Application Priority Data

Nov. 24, 2004   (JP)   ............................ 2004-339633

(51) Int. Cl.
  *G11C 8/00*   (2006.01)
(52) U.S. Cl. .............................. 365/230.04; 365/230.08
(58) Field of Classification Search ........... 365/230.04, 365/230.08, 185.12, 185.17
  See application file for complete search history.

(56) References Cited

U.S. PATENT DOCUMENTS

| | | | |
|---|---|---|---|
| 5,805,498 A | 9/1998 | Lee et al. | |
| 6,058,044 A | 5/2000 | Sugiura et al. | |
| 6,649,945 B1 | 11/2003 | Hosono et al. | |
| 6,813,187 B2* | 11/2004 | Lee | 365/185.18 |
| 6,813,214 B2* | 11/2004 | Cho et al. | 365/230.04 |
| 6,839,276 B2* | 1/2005 | Sugiura et al. | 365/185.03 |
| 7,177,196 B2* | 2/2007 | Takeuchi et al. | 365/185.22 |

FOREIGN PATENT DOCUMENTS

JP    11-176177    7/1999

* cited by examiner

*Primary Examiner*—Vu A. Le
(74) *Attorney, Agent, or Firm*—Oblon, Spivak, McClelland, Maier & Neustadt, P.C.

(57) ABSTRACT

A non-volatile semiconductor memory includes: a cell array including a plurality of memory cells arranged in a matrix; a plurality of bit lines extending in a column direction of the matrix; a sense amplifier configured to amplify data read out from the memory cells via the bit lines; a shield power supply providing a voltage to shield the bit lines; and a bit line selection circuit, configured to connect even bit lines to the shield power supply when odd bit lines are connected to the sense amplifier, and to connect the odd bit lines to the shield power supply when the even bit lines are connected to the sense amplifier.

20 Claims, 19 Drawing Sheets

NON-VOLATILE SEMICONDUCTOR MEMORY

CROSS REFERENCE TO RELATED APPLICATIONS AND INCORPORATION BY REFERENCE

This application is based upon and claims the benefit of priority from the prior Japanese Patent Applications No. 2004-339633, filed on Nov. 24, 2004; the entire contents of which are incorporated herein by reference.

BACKGROUND OF THE INVENTION

1. Field of the Invention

The present invention relates to a non-volatile semiconductor memory, more particularly, to a non-volatile semiconductor memory configured to perform a reading operation using the bit line shield technique.

2. Description of the Related Art

An electrically erasable programmable read-only memory (EEPROM) is known as a non-volatile semiconductor memory. Among EEPROMs, a NAND flash EEPROM having cell units in which a plurality of memory cells are connected to each other in series in a cell array is widely used.

In a NAND flash EEPROM, storage capacity has been increased in order to store a large quantity of data. For miniaturizing a memory cell while increasing the storage capacity, a parasitic capacitance between bit lines, which adjoin each other, is more common compared to a parasitic capacitance between a ground point and a bit line connected to a cell unit in a cell array. For example, when a bit line, which adjoins another bit line having a pre-charged potential, is electrically discharged in a reading operation, the pre-charged potential is decreased by the discharge of the adjoined bit line. Accordingly, a reading error may occur.

In order to prevent reading errors, in a NAND flash EEPROM, a "bit line shield technique" is proposed for solving this problem. In reading operations using the bit line shield technique, one end of a bit line, which is connected to a cell unit in a cell array, is connected via a bit line shield transistor to a shield power supply which supplies a potential for shielding the bit line. Alternatively, the other end of the bit line is connected via a bit line selection transistor to a sense amplifier, which latches a potential of the bit line.

In a NAND flash EEPROM using the bit line shield technique, the data of a group of memory cells (page) which are connected to a common word line are read out in two installments. For example, in a first reading operation, bit line shield transistors which are respectively connected to the odd bit lines are in a conducting state. The shield power supply supplies a ground potential to the odd bit lines, and thereby the odd bit lines are shielded. Simultaneously, the bit line selection transistors which are respectively connected to the even bit lines are in a conducting state, the data of the even bit lines is read out via the sense amplifier.

In a second reading operation, the bit line shield transistors which are respectively connected to the even bit lines are in a conducting state. The shield power supply supplies a ground potential to the even bit lines, and thereby the even bit lines are shielded. Simultaneously, the bit line selection transistors which are connected to the odd bit lines are in a conducting state, and data of the odd bit lines are read out via the sense amplifier.

However, an area of the bit line selection transistors which are connected to one end of the bit lines, and another area of the bit line shield transistors which are connected to the other end of the bit lines, are disposed at opposite sides of the cell array. For this reason, since an integration circuit of the area of the bit line selection transistors and the area of the bit line shield transistors is decreased, there is problem of increasing the circuit area.

SUMMARY OF THE INVENTION

An aspect of the present invention inheres in a non-volatile semiconductor memory including: a cell array including a plurality of memory cells arranged in a matrix; a plurality of bit lines extending in a column direction of the matrix; a sense amplifier configured to amplify data read out from the memory cells via the bit lines; a shield power supply providing a voltage to shield the bit lines; and a bit line selection circuit, configured to connect even bit lines to the shield power supply when odd bit lines are connected to the sense amplifier, and to connect the odd bit lines to the shield power supply when the even bit lines are connected to the sense amplifier.

DETAILED DESCRIPTION OF THE INVENTION

Figure 1:
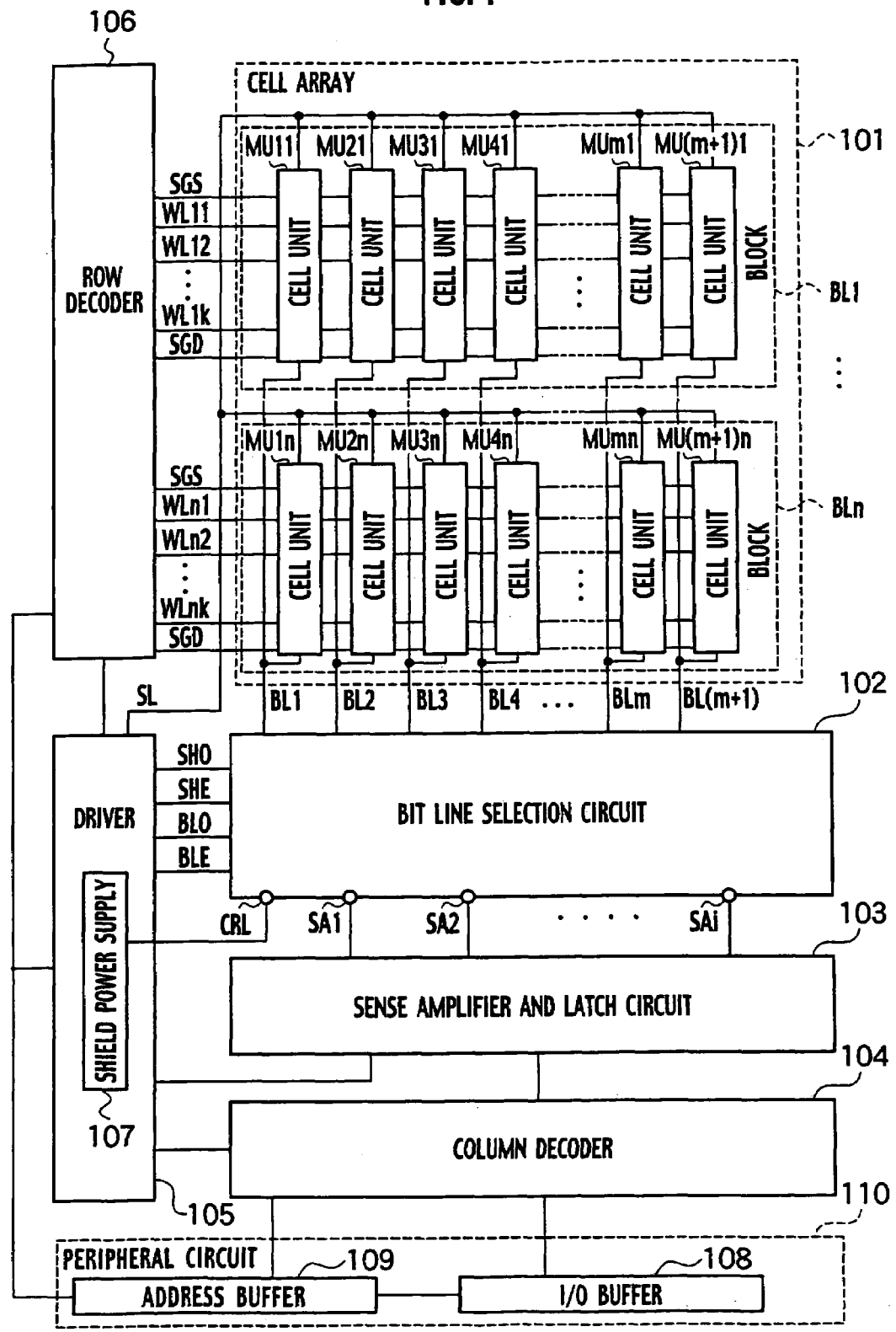
FIG. 1 is a block diagram of a non-volatile semiconductor memory according to an embodiment of the present invention.

An embodiment of the present invention with various modifications will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

In the embodiment of the present invention, a "first main terminal region" is a semiconductor region serving as one of source and drain regions, in a field effect transistor (FET) and a static induction transistor (SIT). A "second main terminal region" other than the first main terminal region. That is, if the first main terminal region is a source region, the second main terminal region is a drain region, and vice versa.

As shown in FIG. 1, a non-volatile semiconductor memory according to an embodiment of the present invention includes: a cell array 101 in which a plurality of memory cells are arranged in a matrix; a plurality of bit lines BL1, BL2, BL3, BL4, . . . , BLm, BL(m+1) which extend in a column direction of the matrix; a sense amplifier 103 configured to amplify data read out from the memory cells via the bit lines BL1, BL2, BL3, BL4, . . . , BLm, BL(m+1); a shield power supply 107 which supplies a voltage to provide a shield between the odd bit lines BL1, BL3, . . . , BLm and between the even bit lines BL2, BL4, . . . , BL(m+1); a bit line selection circuit 102 configured to connect the even bit lines BL2, BL4, . . . , BL(m+1) to the shield power supply 107 when the odd bit lines BL1, BL3, . . . , BLm are connected to the sense amplifier 103, and to connect the odd bit lines BL1, BL3, . . . , BLm to the shield power supply 107 when the even bit lines BL2, BL4, . . . , BL(m+1) are connect to the sense amplifier 103 ("m" is an odd number).

Sense amplifier nodes SA1, SA2, . . . , SAi of the bit line selection circuit 102 are connected to the sense amplifier and latch circuit 103. A shield node CRL of the bit line selection circuit 102 is connected to the shield power supply 107. A driver 105 comprises the shield power supply 107. The sense amplifier and latch circuit 103 are connected to a column decoder 104. The bit line selection circuit 102, the sense amplifier and latch circuit 103, and the column decoder 104 are connected to the driver 105 respectively. The driver 105 and the cell array 101 are connected to the row decoder 106. The driver 105, the column decoder 104 and the row decoder 106 are connected to a peripheral circuit 110.

Figure 2:
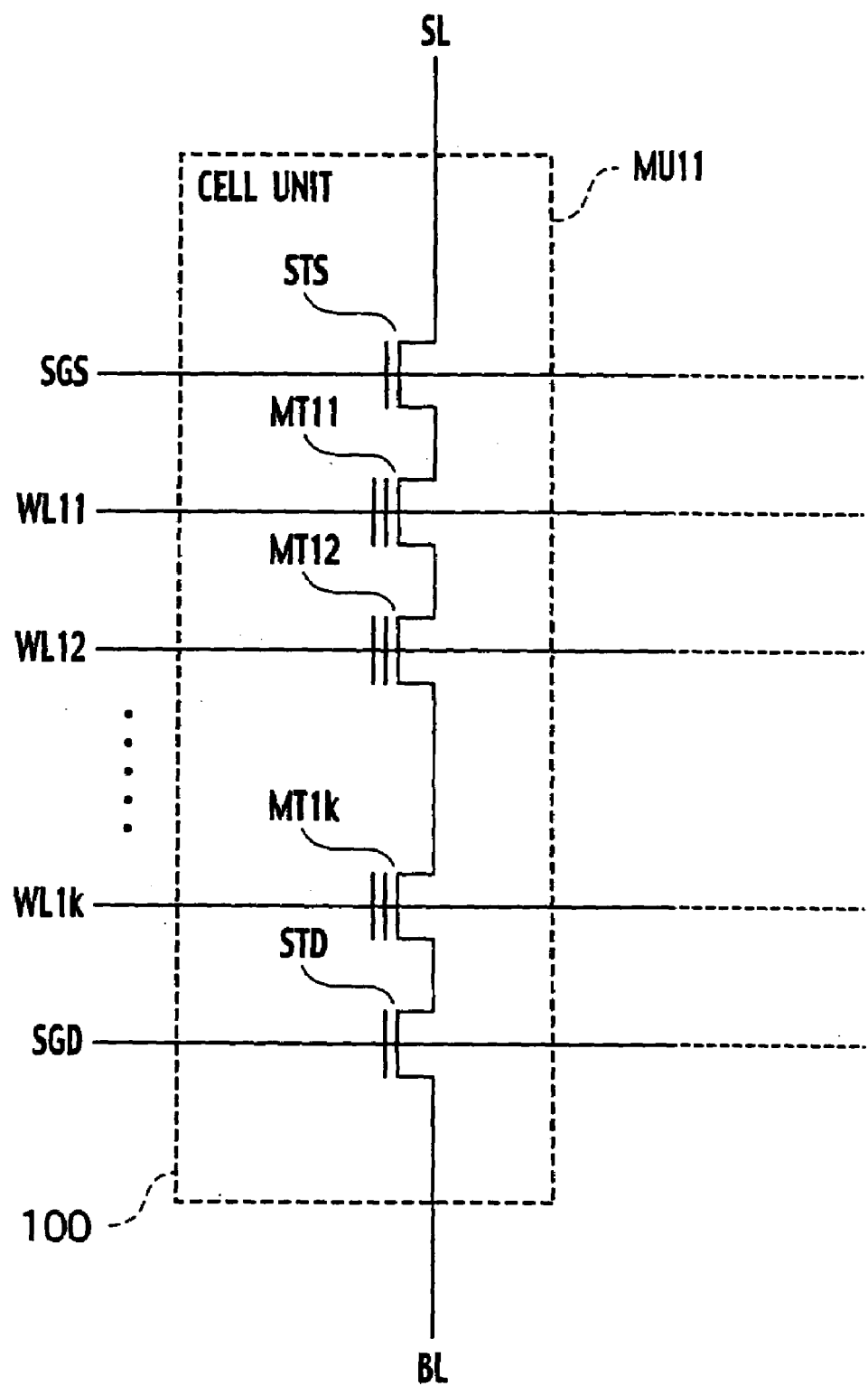
FIG. 2 is an equivalent circuit diagram of a cell unit of the non-volatile semiconductor memory according to the embodiment of the present invention.

The cell array 101 includes a plurality of ((m+1)×n) cell units MU11 to MU(m+1)n ("n" is an integer). The cell units MU11, MU21, MU31, MU41, . . . , MU(m+1) 1, . . . , the cell units MU1n, MU2n, MU3n, MU4n, . . . , MU(m+1) which are arranged in a row direction of the matrix in the cell array 101 are provided in blocks BLK1, . . . , BLKn respectively. For example, the cell unit MU11 includes, as shown in FIG. 2, a plurality of the memory cells MT11 to MT1$k$ which are connected to each other in series, the selection transistors STS and STD which are respectively connected to both ends of a plurality of the memory cells MT11 to MT1$k$. The gate electrodes of each of the memory cells MT11 to MT1$k$ are one part of each of word lines WL11 to WL1$k$ respectively. The cell units MU12 to MU(m+1)n shown in FIG. 1 have similar structures to the cell unit MU11 shown in FIG. 2. The cell units MU11 to MU(m+1)n are connected to a common source line SL. The cell units MU11 to MU(m+1)n are respectively connected to a plurality of the bit lines BL1 to BL(m+1) which are common to the cell units MU11 to MU(m+1)n in the column direction.

The row decoder 106 shown in FIG. 1 selects one block from among the blocks BLK1 to BLKn in the cell array 101 and selects one word line from among the word lines WL11 to 1$k$, . . . WLn1 to WLnk, based on a block address signal and a row address signal from an address buffer 109 in the peripheral circuit 110.

The driver 105 supplies a potential Vsg (for instance, 3.5 V) via the row decoder 106 to the selection gate electrodes SGS and SGD in the selected block, for instance the block BLK1, and supplies a ground potential GND to the selection gate electrodes SGS and SGD in the non-selected blocks BLK2 to BLKn. Furthermore, the driver 105 supplies the ground potential GND via the row decoder 106 to the selected word line, for instance, the word line WL11, and supplies a voltage Vs (for instance, 3.5 V) to the non-selected word lines WL12 to WL1$k$, . . . WLn1 to WLnk in a reading operation.

The column decoder 104 selects one bit line from among a plurality of the bit lines BL1 to BL(m+1), based on a column address signal from the address buffer 109 in the peripheral circuit 110. The sense amplifier and latch circuit 103 amplifies and latches data, which is read out from the selected bit line, for example the bit line BL1, and transmitted via the bit line selection circuit 102. The data latched by the sense amplifier and latch circuit 103 is transmitted via the column decoder 104 to an I/O buffer 108 in the peripheral circuit 110. The shield power supply 107 supplies the ground potential GND via the shield node CRL to the bit line selection circuit 102 in a reading operation. Note that the shield power supply 107 supplies a power supply voltage VDD (for instance, 2.5 V) via the shield node CRL to the bit line selection circuit 102 in a writing operation.

Figure 3:
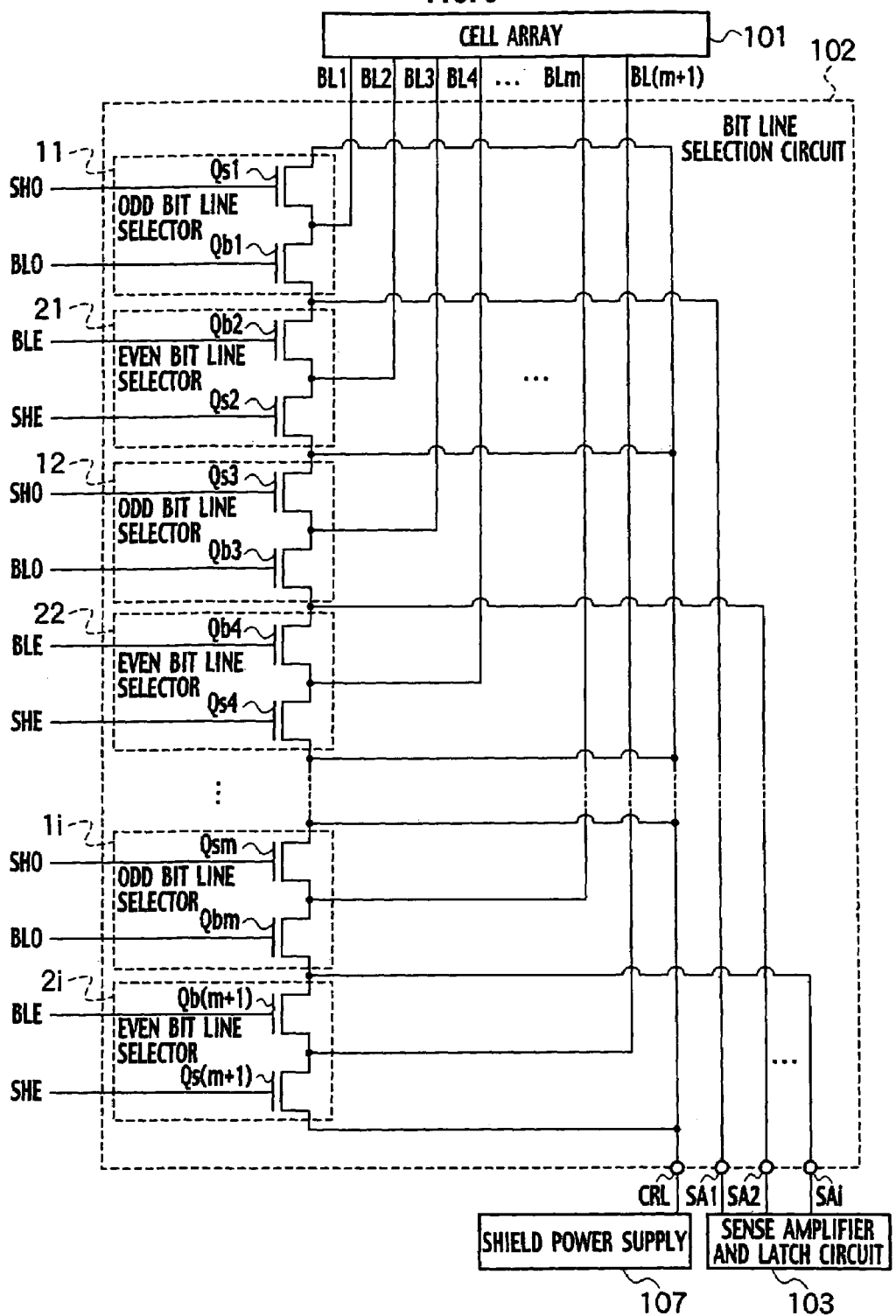
FIG. 3 is an equivalent circuit diagram of a bit line selection circuit of the non-volatile semiconductor memory according to the embodiment of the present invention.

As shown in FIG. 3, the bit line selection circuit 102 includes odd bit line selectors 11, 12, . . . , 1i and even bit line selectors 21, 22, . . . , 2i (I is a half number of (m+1) The odd bit line selectors 11, 12, . . . , 1i are connected between the odd bit lines BL1, BL3, . . . , BLm and the sense amplifier 103, and between the odd bit lines BL1, BL3, . . . , BLm and the shield power supply 107. The even bit line selectors 21, 22, 2i are connected between the even bit lines BL2, BL4, BL(m+1) and the sense amplifier 103, and between the even bit lines BL2, BL4, . . . , BL(m+1) and the shield power supply 107.

Each of the odd bit line selectors 11, 12, . . . , 1i selects the odd bit lines BL1, BL3, . . . , BLm respectively so as to connect to the shield power supply 107 when the even bit lines BL2, BL4, . . . , BL(m+1) are connected to the sense amplifier 103. Each of the odd bit line selectors 11, 12, . . . , 1i selects the odd bit lines BL1, BL3, . . . , BLm respectively so as to connect to the sense amplifier 103 when the even bit lines BL2, BL4, . . . , BL(m+1) are connected to the shield power supply 107.

The odd bit line selector 11 includes an odd shield transistor Qs1 and an odd selection transistor Qb1. A first main terminal region (source region) of the odd shield transistor Qs1 is connected to the odd bit line BL1, and a second main terminal region (drain region) of the odd shield transistor Qs1 is connected to the shield power supply 107 via the shield node CRL. A source region of the odd selection transistor Qb1 is connected to the source region of the odd shield transistor Qs1, and a drain region of the odd selection transistor Qb1 is connected to the sense amplifier 103 via the sense amplifier node SA1. Each of a gate electrode SHO of the odd shield transistor Qs1 and a gate electrode BLO of the odd selection transistor Qb1 is respectively connected to the driver 105 shown in FIG. 1.

Each of the odd shield transistors Qs1, Qs3, . . . , Qsm shown in FIG. 3 selects the odd bit lines BL1, BL3, . . . , BLm respectively so as to connect via the shield node CRL to the shield power supply 107 when the driver 105 supplies a power supply voltage VDD to the gate electrode SHO. Each of the odd selection transistors Qb2, Qb4, . . . , Qb(m+1) selects the odd bit lines BL1, BL3, . . . , BLm respectively so as to connect via the sense amplifier node CRL to the sense amplifier 103 when the driver 105 provides a power supply voltage VDD to the gate electrode BL0.

The even bit line selector 21 shown in FIG. 3 selects the even bit lines BL2, BL4, . . . , BL(m+1) respectively so as to connect to the shield power supply 107 when the odd bit lines BL1, BL3, . . . , BLm are connected to the sense amplifier 103. The even bit line selector 21 selects the even bit lines BL2, BL4, . . . , BL(m+1) respectively so as to connect to the sense amplifier 103 when the odd bit lines BL1, BL3, . . . , BLm are connected to the shield power supply 107.

The even bit line selectors 21 includes an even selection transistor Qb2 and an even shield transistor Qs2. A source region of the even selection transistor Qb2 is connected to the even bit lines BL2, and a drain region of the even selection transistor Qb2 is connected to the drain region of the odd selection transistor Qb1. A source region of the even shield transistor Qs2 is connected to the source region of the even selection transistor Qb2, and a drain region of the even shield transistor Qs2 is connected to the shield power supply 107 via the shield node CRL. A gate electrode SHE of the even shield transistor Qs2, and the gate electrode BLE of the even selection transistor Qb2 are connected to the driver 105 shown in FIG. 1 respectively.

Each of the even selection transistors Qb2, Qb4, Qb(m+1) selects the even bit lines BL2, BL4, . . . , BL(m+1) respectively so as to connect via the sense amplifier node CRL to the sense amplifier 103 when the driver 105 shown in FIG. 1 provides a power supply voltage VDD to the gate electrode BLE. Each of the even shield transistors Qs2, Qs4 , . . . , Qs(m+1) selects the even bit lines BL2, BL4, . . . , BL(m+1) respectively so as to connect via the shield node CRL to the shield power supply 107 when the driver 105 provides a power supply voltage VDD to the gate electrode SHE.

In the bit line selection circuit 102 shown in FIG. 3, the odd bit line selectors 12, . . . , 1i, which include the odd shield transistors Qs1, Qs3, . . . , Qsm and the odd selection transistors Qb1, Qb3, . . . , Qbm respectively, and the even bit line selectors 21, 22, . . . , 2i, which include the even shield transistors Qs2, Qs4, . . . , Qs(m+1) and the even selection transistor Qb2, Qb4,. . . , Qb(m+1) respectively, are alternately connected to each other. The driver 105 shown in FIG. 1 is also connected to the gate electrode SHO of the odd shield transistors Qs3, . . . , Qsm, the gate electrode BL0 of the odd selection transistors Qb4, . . . , Qbm, the gate electrode SHE of the even shield transistors Qs4, . . . , Qs(m+1), and the gate electrode BLE of the even selection transistors Qb4, . . . , Qb(m+1) respectively.

Figure 4:
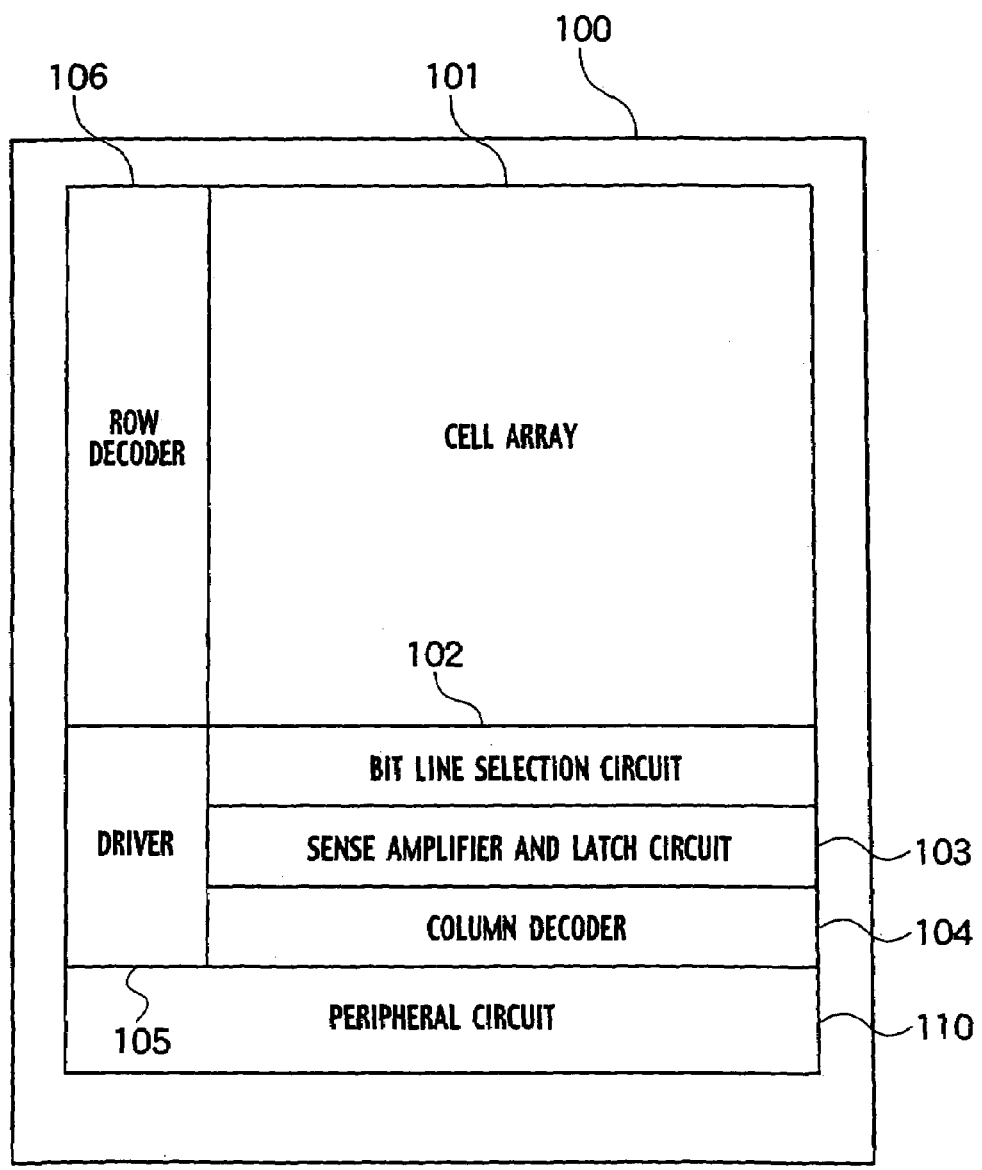
FIG. 4 is a plan view showing a layout of the non-volatile semiconductor memory according to the embodiment of the present invention.

As shown in FIG. 4, the non-volatile semiconductor memory (semiconductor integrated circuit) shown in FIG. 1 is monolithically integrated on the semiconductor chip 100. The bit line selection circuit 102 is disposed to adjoin the cell array 101 in the column direction. In a plan view, the sense amplifier and latch circuit 103, and the column decoder 104 are disposed at the bit line selection circuit 102 on the opposite side of the cell array 101, so as to adjoin with each other in the column direction. The row decoder 106 is disposed at the cell array 101 so as to adjoin with the cell array 101 in the row direction. The driver 105 is disposed at a side of the row decoder 106 so as to adjoin with the row decoder 106 in the column direction, and adjoin with the bit line selection circuit 102, the sense amplifier and latch circuit 103 and the column decoder 104 in the row direction. The peripheral circuit 110 is disposed at the driver 105 so as to adjoin with the driver 105 and the column decoder 104 in the column direction.

Figure 5:
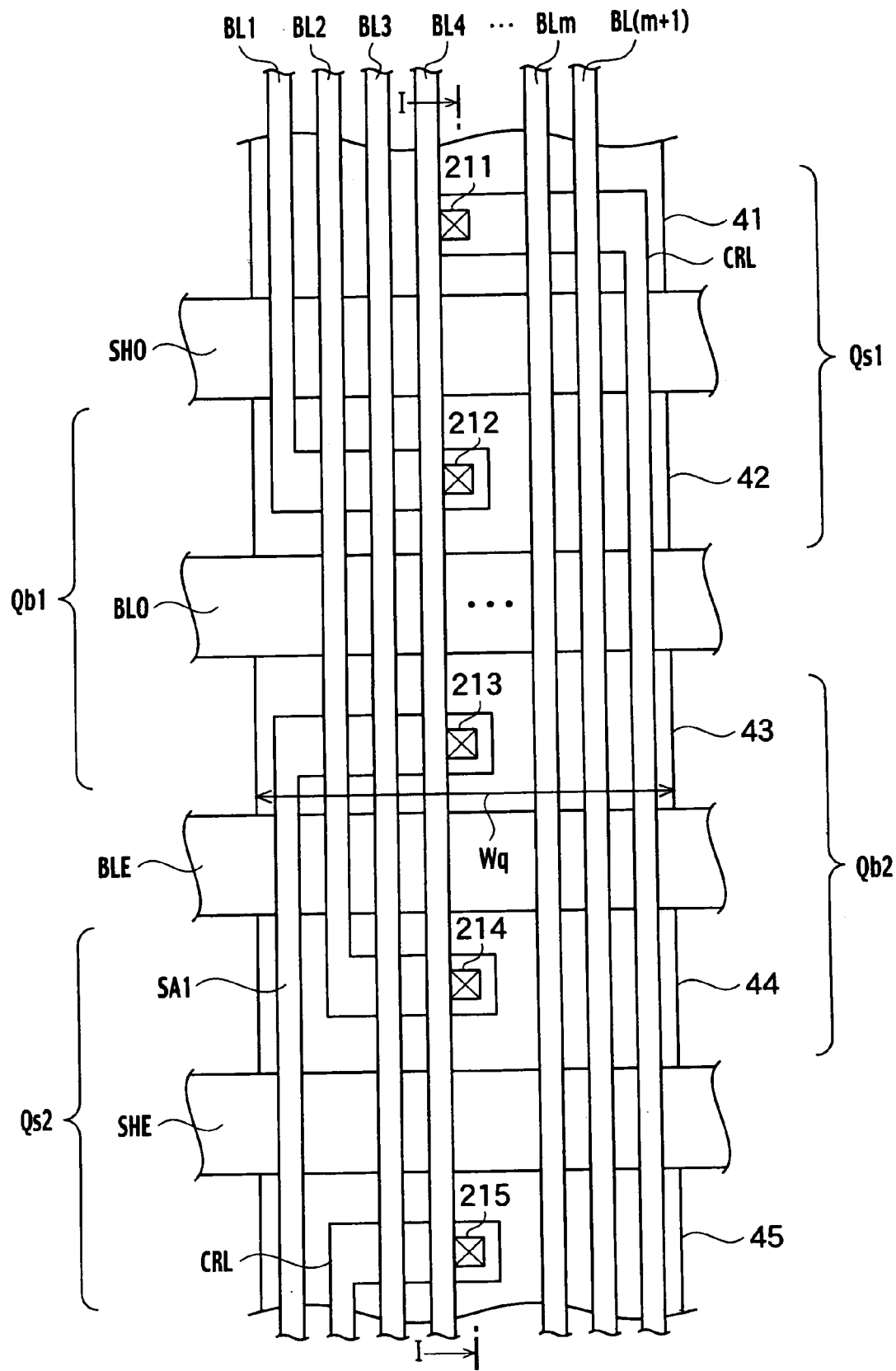
FIG. 5 is a plan view of the bit line selection circuit of the non-volatile semiconductor memory according to the embodiment of the present invention.

As shown in FIG. 5, the odd shield transistor Qs1, the odd selection transistor Qb2, the even shield transistor Qs2 and the even selection transistor Qb2 are arranged in the column direction of the cell array 101. A plurality of the bit lines BL1 to BL(m+1) are arranged to extend in the column direction on the odd shield transistor Qs1, the odd selection transistor Qb2, the even shield transistor Qs2 and the even selection transistor Qb2. The width Wq of each of the odd shield transistor Qs1, the odd selection transistor Qb2, the even selection transistor Qb2 and the even shield transistor Qs2 is substantially equal to the width of a plurality of the bit lines BL1 to BL(m+1). Note that, however, an illustration is omitted in FIG. 5. The odd shield transistor Qs3, . . . , Qsm, the odd selection transistor Qb4, . . . , Qb(m+1), the even shield transistor Qs4, . . . , Qs(m+1) and the even selection transistor SQb4, . . . , Qb(m+1) shown in FIG. 3 are disposed adjacent to the even selection transistor Qb2.

Figure 6:
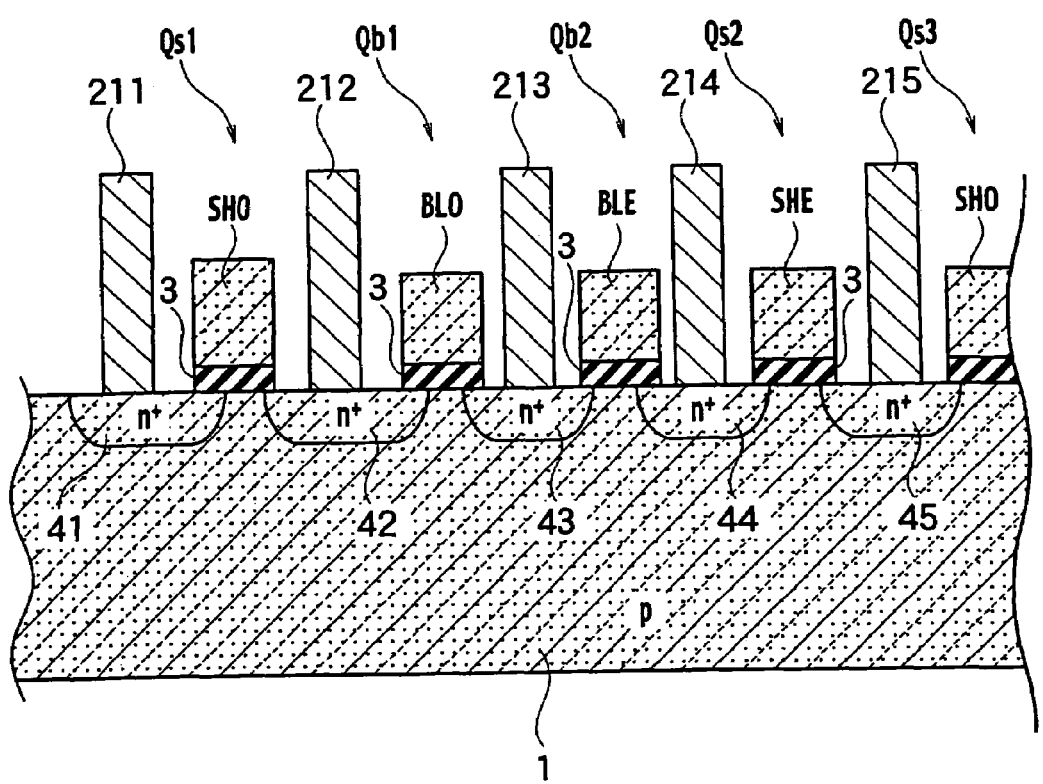
FIG. 6 is a cross-sectional view (in I-I direction of FIG. 5) of the bit line selection circuit of the non-volatile semiconductor memory according to the embodiment of the present invention.

As shown in FIG. 6, the odd shield transistor Qs1 of the bit line selection circuit 102 includes a drain region 41 disposed on a semiconductor substrate 1 and a source region 42 disposed to adjoin the drain region 41. A selection gate electrode SHO is disposed via a gate insulating film 3 on a channel region interposed between the drain region 41 and the source region 42. The odd selection transistor Qb2 includes a source region 42 and a drain region 43 disposed to adjoin the source region 42. A selection gate electrode BL0 is disposed via a gate insulating film 3 on a channel region interposed between the source region 42 and the drain region 43. The even selection transistor Qb2 includes a drain region 43 and a source region 44 disposed to adjoin the drain region 43. A selection gate electrode BLE is disposed via a gate insulating film 3 on a channel region interposed between the drain region 43 and the source region 44. The odd selection transistor Qb2 includes a source region 44 and a drain region 45 disposed to adjoin the source region 44. A selection gate electrode SHE is disposed via a gate insulating film 3 on a channel region interposed between the source region 44 and the drain region 45.

A shield node contact 211 is disposed on the drain region 41. The shield node contact 211 is connected via the shield node CRL to the shield power supply 107. A bit line contact 212 is disposed on the source region 42. The bit line contact 212 is connected to the odd bit lines BL1. A sense amplifier contact 213 is disposed on the drain region 43. The sense amplifier contact 213 is connected via the sense amplifier node SA1 to the sense amplifier 103. A bit line contact 214 is disposed on the source region 44. The bit line contact 214 is connected to the even bit line BL2. A sense amplifier contact 215 is disposed on the drain region 45. The sense amplifier contact 215 is connected via the sense amplifier node SA2 to the sense amplifier 103.

Here, the source region 42 of the odd shield transistor Qs1 and the source region 42 of the odd selection transistor Qb1 are common to each other. The drain region 43 of the odd selection transistor Qb1 and the drain region 43 of the even selection transistor Qb2 are common to each other. The source region 44 of the even selection transistor Qb2 and the source region 44 of the even shield transistor Qs2 are common to each other. Furthermore, the drain region 45 of the even shield transistor Qs2 and the drain region 45 of the odd shield transistor Qs3 are common to each other.

The odd shield transistors Qs3, ..., Qsm, the odd selection transistors Qb4, ..., Qb(m+1), the even shield transistors Qs4, ..., Qs(m+1) and the even selection transistors Qb4, ..., Qb(m+1) shown in FIG. 3 are substantially respectively similar to the odd shield transistor Qs1, the odd selection transistor Qb2, the even shield transistor Qs2 and the even selection transistor Qb2 shown in FIG. 6. Namely, each of source regions of the odd shield transistors Qs3, ..., Qsm and each of source regions of the odd selection transistors Qb4, ..., Qb(m+1) are common to each other. Each of the drain regions of the odd selection transistors Qb4, ..., Qb(m+1) and each of the drain regions of the even shield transistors Qs4, ..., Qs(m+1) are common to each other. Each of the source regions of the even shield transistors Qs4, ..., Qs(m+1) and each of the source regions of the even selection transistors Qb4, ..., Qb(m+1) are common to each other. Each of the drain regions of the even selection transistors Qb4, ..., Qb(m−1) and each of the drain regions of the odd shield transistors Qs3, ..., Qsm are common to each other.

Next, an example of a reading operation of the nonvolatile semiconductor memory according to the embodiment of the present invention, using the bit line shield technique, will be described. Here, data from each of the even bit lines BL2, BL4, ..., BL(m+1) shown in FIG. 3 and data from each of the odd bit lines BL1, BL3, ..., BLm are read out in two installments.

First, the driver 105 shown in FIG. 1 supplies a ground potential GND to the gate electrodes SHO of the odd shield transistors Qs1, Qs3, ..., Qs of the bit line selection circuit 102, the gate electrodes BLO of the odd selection transistors Qb1, Qb3, ..., Qbm, the gate electrodes BLE of the even selection transistors Qb2, Qb4, ..., Qb(m+1), and the gate electrodes SHE of the even shield transistors Qs2, Qs4, ..., Qs(m+1). As a result, all of the odd shield transistors Qs1, Qs3, ..., Qs, the odd selection transistor Qb1, Qb3, ..., Qbm, the even selection transistor Qb2, Qb4, ..., Qb(m+1), and the even shield transistors Qs2, Qs4, ..., Qs(m+1) is in nonconducting state.

For example, when the even bit lines BL2, BL4, ..., BL(m+1) are selected, the shield power supply 107 shown in FIG. 1 provides a power supply voltage VDD (for instance, 2.5 V). The driver 105 applies the power supply voltage VDD to the gate electrodes SHE of the even shield selection transistors Qs2, Qs4, ..., Qs(m+1), so that each of the even shield transistors Qs2, Qs4, ..., Qs(m+1) is in a conducting state. Therefore, the even bit lines BL2, BL4, ..., BL(m+1) are connected via the shield node CRL to the shield power supply 107. As a result, the power supply voltage VDD is supplied from the shield power supply 107 via the shield node CRL, and thereby the even bit lines BL2, BL4, ..., BL(m+1) are pre-charged with the power supply voltage VDD. Thereafter, the ground potential GND is applied to the gate electrodes SHE of the even shield selection transistors Qs2, Qs4, ..., Qs(m+1), and thereby the even shield selection transistors Qs2, Qs4, ..., Qs(m+1) are in nonconducting state.

Figure 7:
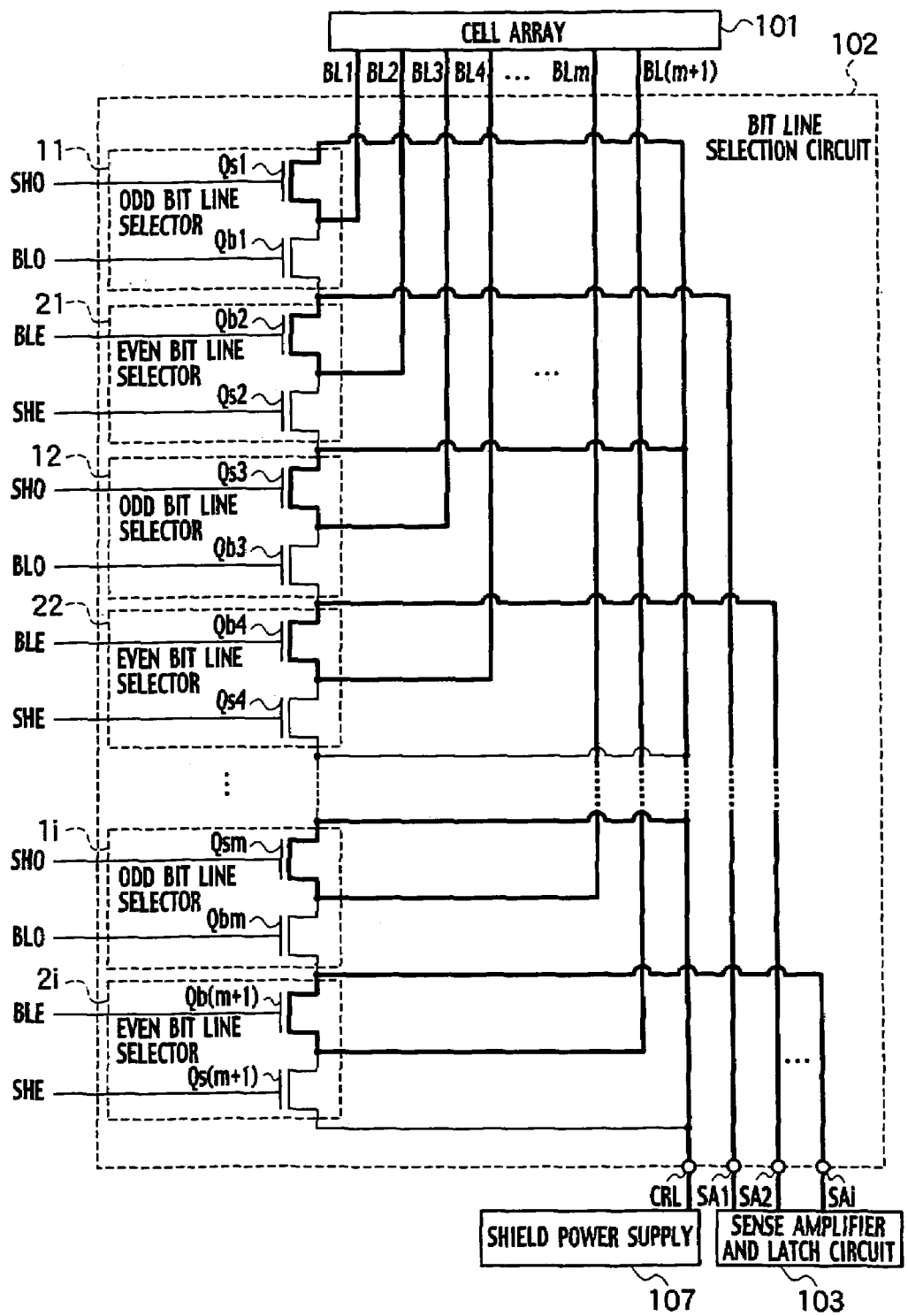
FIG. 7 is an equivalent circuit diagram for explaining reading operation of odd bit lines of the non-volatile semiconductor memory according to the embodiment of the present invention.

Then, the shield power supply 107 supplies the ground potential GND. As shown in FIG. 7, the driver 105 applies the power supply voltage VDD to the gate electrodes SHO of the odd shield transistors Qs1, Qs3, ..., Qsm, and thereby the odd shield transistors Qs1, Qs3, ..., Qsm is in a conducting state. Therefore, the odd bit lines BL1, BL3, ..., BLm are electrically connected via the shield node CRL to the shield power supply 107. As a result, the power supply voltage GND is supplied from the shield power supply 107 via the shield node CRL, and thereby the odd bit lines BL1, BL3, ..., BLm are set with the ground potential GND by shielding.

Next, for example, 3.3 V is applied to the source line SL. The row decoder 106 selects objects for the reading operation, for instance, the block BLK1 and the word line WL11, based on a block address signal and a row address signal from the address buffer 109. The driver 105 supplies the selection voltage Vsg (for instance, 3.5 V) to the selection gate electrodes SGS and SGD of the selected block BLK1, and supplies the ground potential GND to the selection gate electrodes SGS and SGD of the non-selected blocks BLK2 to BLKn. Furthermore, the driver 105 supplies non-selection voltage Vcg (for instance, 3.5 V) to the non-selected word lines WL12 to 1k, ..., WLn1 to WLnk, and supplies the ground potential GND to the selected word line WL11.

In the group of memory cells (page) which is connected to the selected word line WL11, when the memory cell data is "0", since a threshold value of the memory cell is more than 0 V, the memory cells are in nonconducting state. For this reason, the even bit lines BL2, BL4, ..., BL(m+1) maintain the pre-charged power supply voltage VDD. Alternatively, when the memory cell data is "1", since the threshold value of the memory cells is less than 0 V, the memory cells are in a conducting state. For this reason, the even bit lines BL2, BL4, ..., BL(m+1) emit electric charges. Therefore, the potential of the even bit lines BL2, BL4, ..., BL(m+1) is decreased.

The power supply voltage VDD is applied to the gate electrode BLE of the even selection transistor Qbe, and thereby the even selection transistor Qbe is in a conducting state. Accordingly, the even bit lines BL2, BL4, ..., BL(m+1) are connected via the sense amplifier nodes SA1, SA2, ..., SAi to the sense amplifier 103. The potentials of the even bit lines BL2, BL4, ..., BL(m+1) are amplified by the sense amplifier 103, and latched by the latch circuit 103.

Thereby, the reading operation is completed. Data latched by the latch circuit 103 is transmitted via the column decoder 104 to the I/O buffer 108 in the peripheral circuit 110, and then externally transmitted from the semiconductor chip 100.

Figure 8:
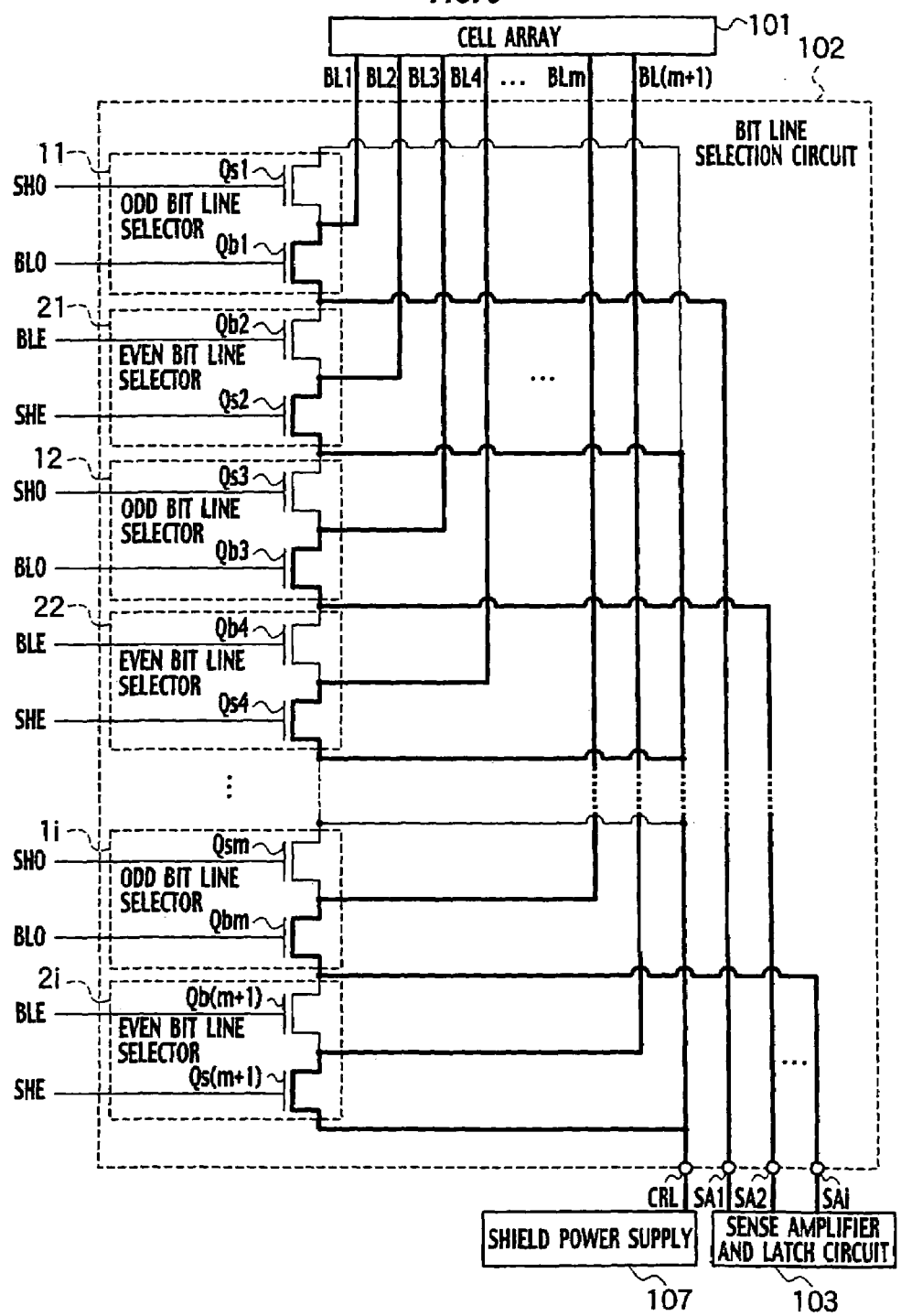
FIG. 8 is an equivalent circuit diagram for explaining reading operation of even bit lines of the non-volatile semiconductor memory according to the embodiment of the present invention.

Thereafter, as shown in FIG. 8, the selected bit lines and the shield bit lines are exchanged each other. Namely, the even bit lines BL2, BL4, . . . , BL(m+1) are to be the shield bit lines, and the odd bit lines BL1, BL3, . . . , BLm are to be the selected bit lines. In the same manner as the above steps, the even bit lines BL2, BL4, . . . , BL(m+1) are shielded while reading the data out from the odd bit lines BL1, BL3, . . . , BLm.

According to the read operation using bit line shield technique, the non-selected bit lines which adjoin both sides of the selected bit line are set to the ground potential GND and shielded. Therefore, it is possible to prevent a change in the potential of the selected bit line due to changes in the potential of the non-selected bit lines which adjoin the selected bit line on opposite side each other. Thus, it is possible to reduce reading errors.

Figure 17:
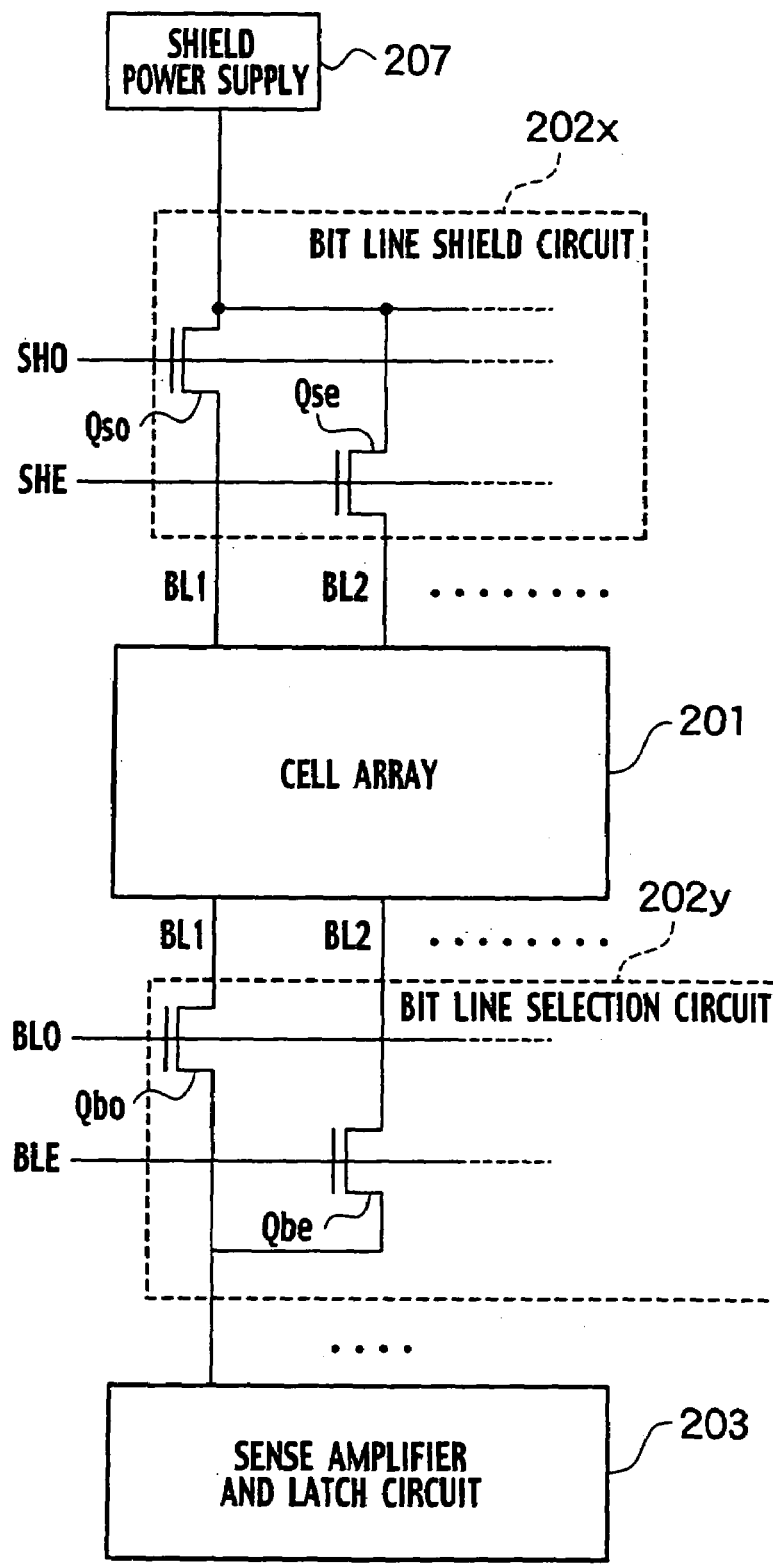
FIG. 17 is a block diagram of a non-volatile semiconductor memory in a comparative example.
Figure 18:
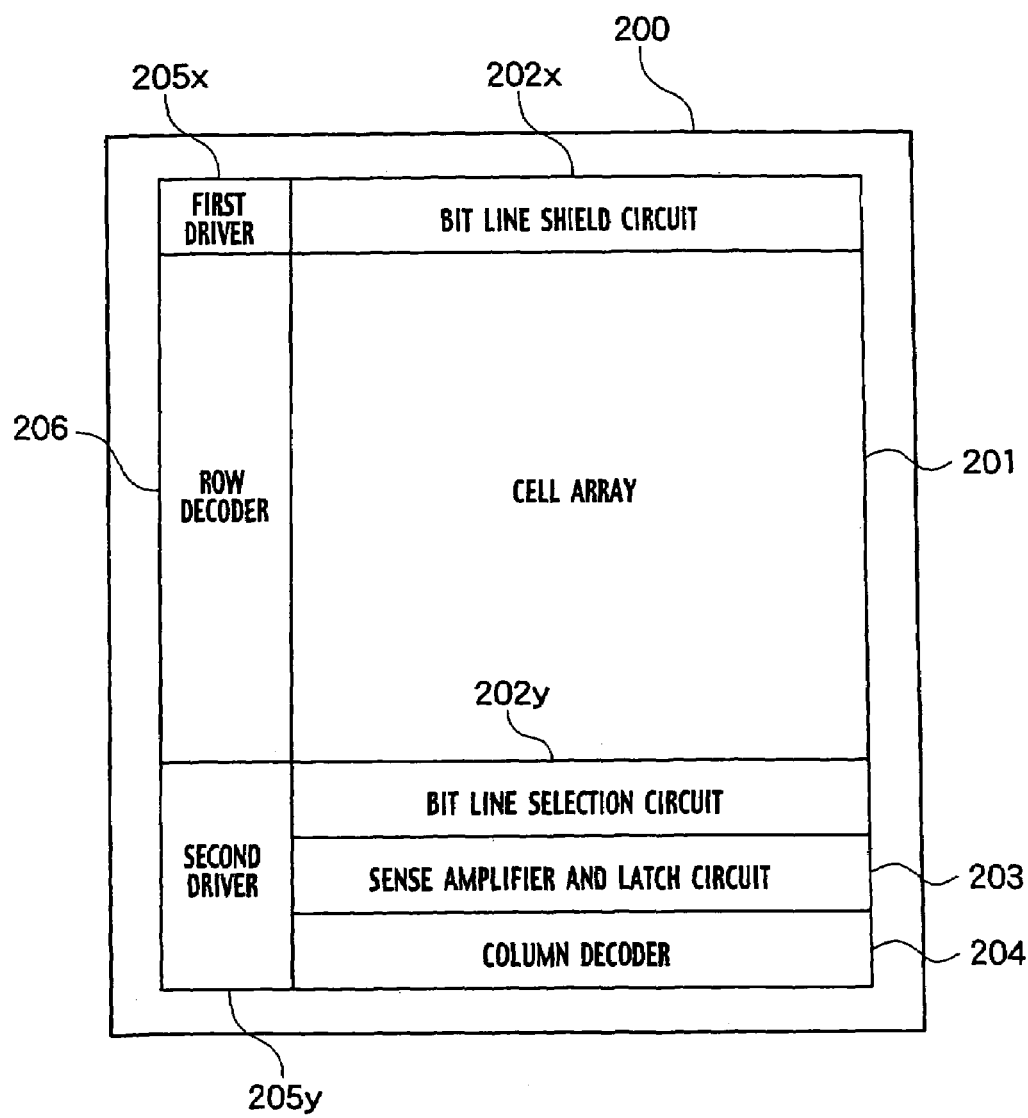
FIG. 18 is a plan view of the non-volatile semiconductor memory in the comparative example.
Figure 19:
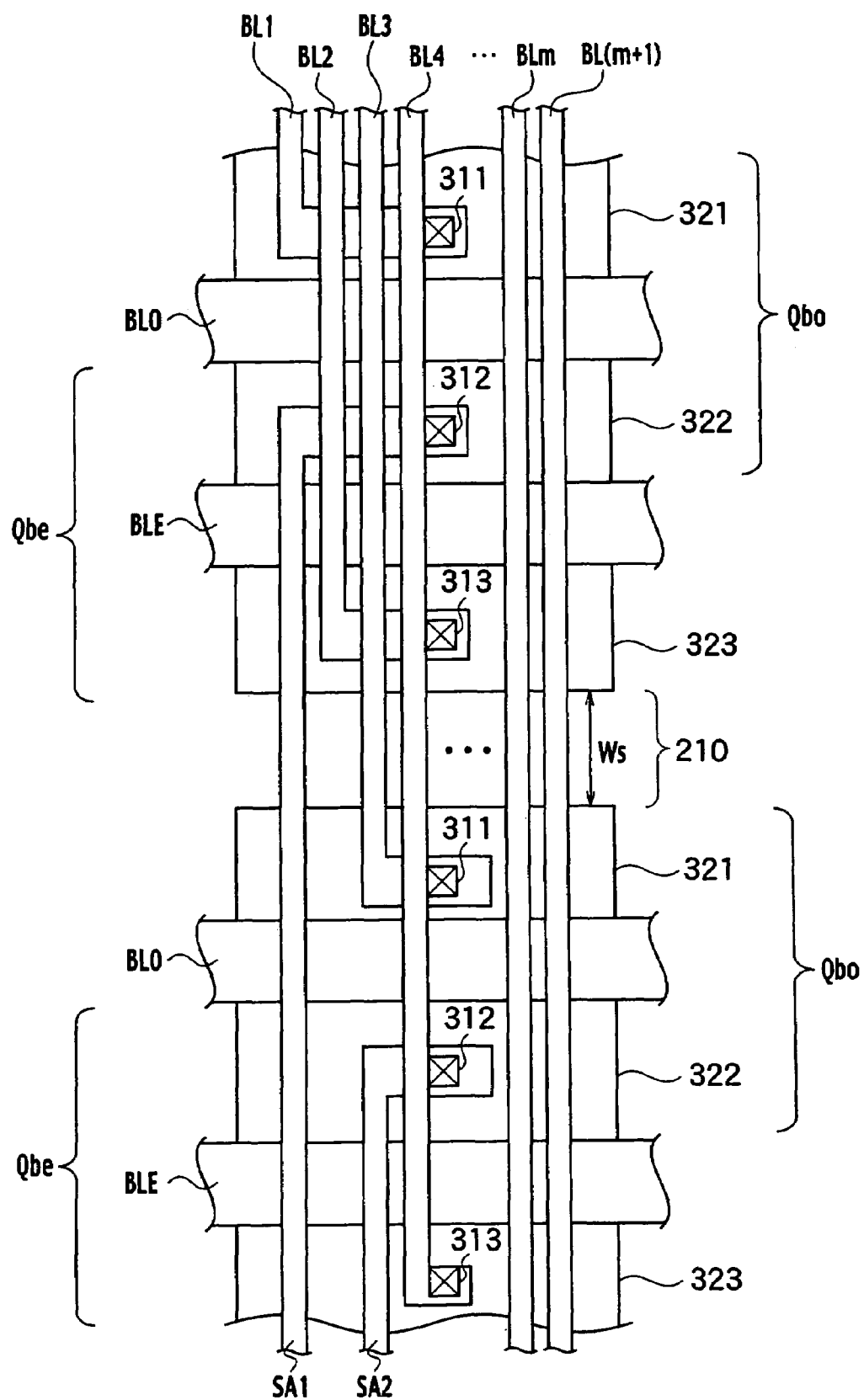
FIG. 19 is a plan view of a bit line selection circuit of the non-volatile semiconductor memory in the comparative example.

A NAND flash EEPROM of the comparative example for comparison with the non-volatile semiconductor memory, shown in FIG. 1, is shown in FIGS. 17 to 19. In FIG. 17, one end, of each of a plurality of bit lines BL1, BL2, . . . which are connected to memory cells of a cell array 201, is connected via bit line shield transistors Qso, Qse, . . . to a shield power supply 207. The other end of each of the plurality of bit lines BL1, BL2, . . . is connected via the bit line selection transistors Qbo, Qbe, . . . to the sense amplifier and latch circuit 203.

As shown in FIG. 18, on a semiconductor chip 200 of the comparative example, a bit line shield circuit 202x and a bit line selection circuit 202y are disposed interposing the cell array 201 in the row direction. The bit line shield circuit 202x includes the bit line shield transistors Qso, Qse, . . . shown in FIG. 17, and the bit line selection circuit 202y includes the bit line selection transistors Qbo, Qbe, . . . The sense amplifier and the latch circuit 203, and the column decoder 204 are disposed to adjoin the bit line selection circuit 202y on an opposite side of the cell array 201 in the row direction. The row decoder 206 is disposed to adjoin the cell array 201 in the column direction. The first driver 205x is disposed to adjoin the bit line shield circuit 202x in the row direction, and to adjoin the row decoder 206 in the column direction. The second driver 205y is disposed to adjoin the bit line selection circuit 202y, the sense amplifier and latch circuit 203, the column decoder 204 in the row direction, and to adjoin the row decoder 206 in the column direction.

In the comparative example shown in FIG. 18, since the bit line shield circuit 202x and the bit line selection circuit 202y are disposed so as to be separated from each other, integration circuit of the circuits is decreased, and the circuit area is increased. By contrast, according to the embodiment of the present invention, as shown in FIG. 1, the bit line selection circuit 102 is connected between a plurality of the bit lines BL1 to BL(m+1) and the shield power supply 107, and between a plurality of the bit lines BL1 to BL(m+1) and the sense amplifier 103. The bit line selection circuit 102 includes functions corresponding to both functions of the bit line shield circuit 202x and the bit line selection circuit 202y shown in FIG. 18.

For this reason, as shown in FIG. 4, the bit line selection circuit 102 shown in FIG. 3 is disposed to adjoin the cell array 101 on the semiconductor chip 100 in the column direction. Therefore, the odd shield transistors Qs1, Qs3, . . . , Qs, the even shield transistors Qs2, Qs4, . . . , Qs(m+1), the odd selection transistors Qb1, Qb3, . . . , Qbm and the even selection transistors Qb2, Qb4, . . . , Qb(m+1) provided in the bit line selection circuit 102 are grouped in one area. As a result, it is possible to increase the integration circuit of the circuits, and to reduce the circuit area.

Furthermore, in the comparative example shown in FIG. 18, since the first driver 205x and the second driver 205y are diversely disposed, the integration circuit of the circuits is decreased. Alternatively, according to the embodiment of the present invention, as shown in FIG. 4, the driver 105 which drives the bit line selection circuit 102 is also provided to one area. Therefore it is possible to increase the integration circuit of the circuits and to reduce the circuit area.

In the comparative example, as shown in FIG. 19 in the bit line shield circuit 202x, and the bit line shield transistors Qso and Qse, which are half the number of the bit lines BL1 to BL(m+1), are arranged in the column direction. Each of the bit line shield transistors Qso and Qse include source regions 321 and 323 and drain region 322. Gate electrodes BL0 and BLE are respectively disposed on channel regions interposed between the source region 321 and the drain region 322, and between the source region 323 and the drain region 322. The bit line shield transistors Qso and Qse, which adjoin each other, share the drain region 322 with each other and are provided as a pair. The pair of bit line shield transistors Qso and Qse is isolated from each other by the element isolation area (STI) 210.

Here, for erasing data, a high voltage is applied to the p-well of the cell array 201, so that the high voltage is also applied to the bit lines BL1 to BL(m+1) via the source region 321 which is disposed in the p-well. For this reason, the width Ws of an element isolation area 210 between the pair of bit line shield transistors Qso and Qse has to be large, so as to prevent destruction due to the potential difference applied between the pair of bit line shield transistors Qso and Qse. As a result, the circuit area is increased. Even worse, with the miniaturization of pitch of the bit lines BL1 to BL(m+1), the number of bit line shield transistors is increased. For this reason, the number of element isolation areas 210 between the pair of bit line shield transistors Qso and Qse has increased for each technology generation. Also in the bit line selection circuit 202y shown in FIG. 17, the same as the bit line shield circuit 202x, the element isolation area is provided between the pair of bit line selection transistors Qbo and Qbe.

By contrast, according to the embodiment of the present invention, as shown in FIGS. 5 and 6, the odd shield transistors Qs1, Qs3, . . . , Qs, the even shield transistors Qs2, Qs4, . . . , Qs(m+1), the odd selection transistor Qb1, Qb3, . . . , Qbm and the even selection transistor Qb2, Qb4, . . . , Qb(m+1) share the source regions 42, 43, . . . and the drain regions 41, 43, 45, . . . with each other, so that the element isolation area 210 shown in FIG. 19 is unnecessary. Therefore, it is possible to reduce the circuit area.

(First Modification)

Figure 9:
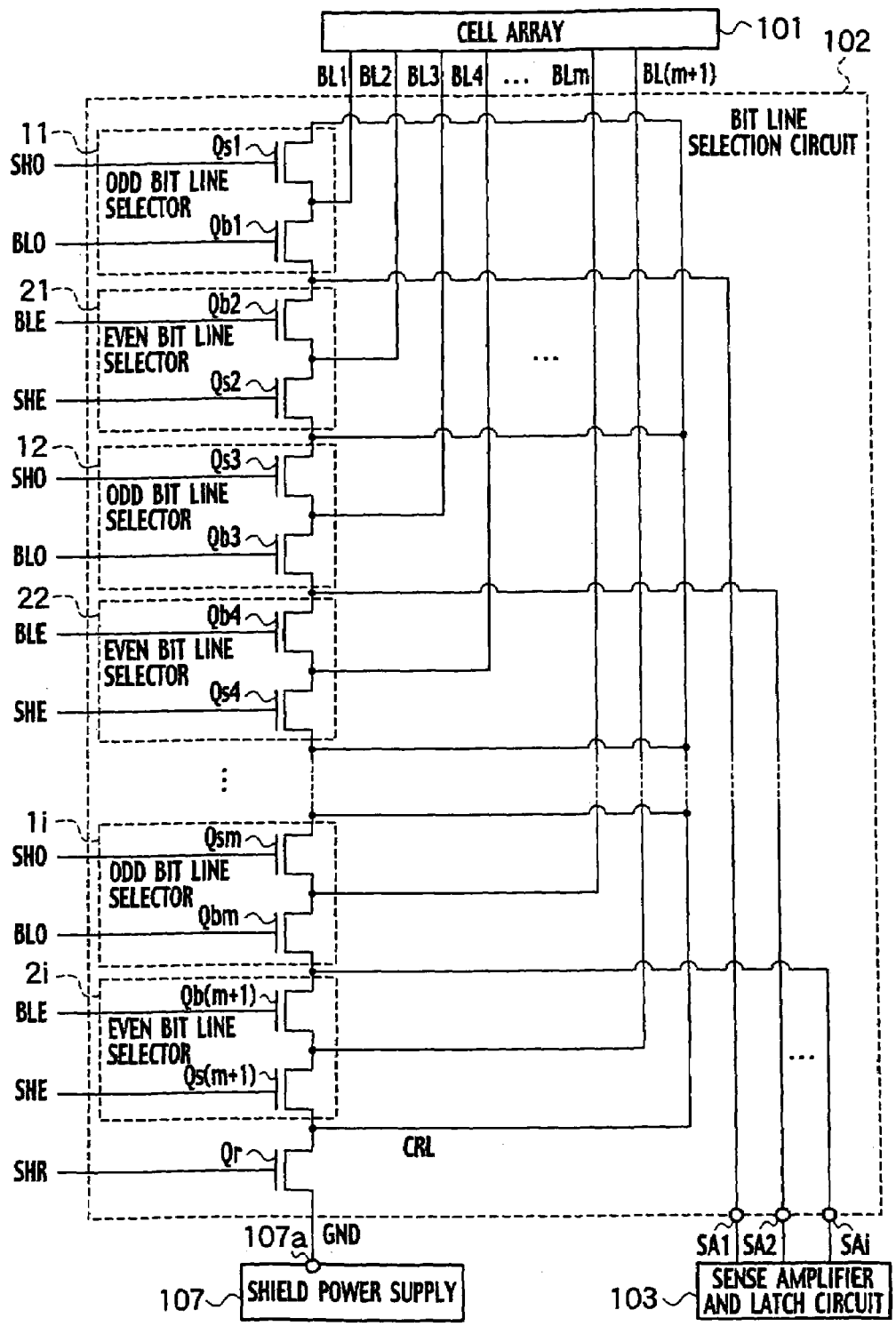
FIG. 9 is an equivalent circuit diagram of a bit line selection circuit of a non-volatile semiconductor memory according to a first modification of the present invention.

As shown in FIG. 9, a non-volatile semiconductor memory according to a first modification of the present invention is different from the bit line selection circuit 102 shown in FIG. 3 in that the bit line selection circuit 102 further includes a ground potential transistor Qr. A source region of the ground potential transistor Qr is connected to the drain region of the odd shield transistors Qs1, Qs3, . . . , Qsm and the even shield transistors Qs2, Qs4, . . . , Qs(m+1), and a drain region of the ground potential transistor Qr is connected to the ground potential output node 107a of the shield power supply 107 via the shield node CRL.

Figure 10:
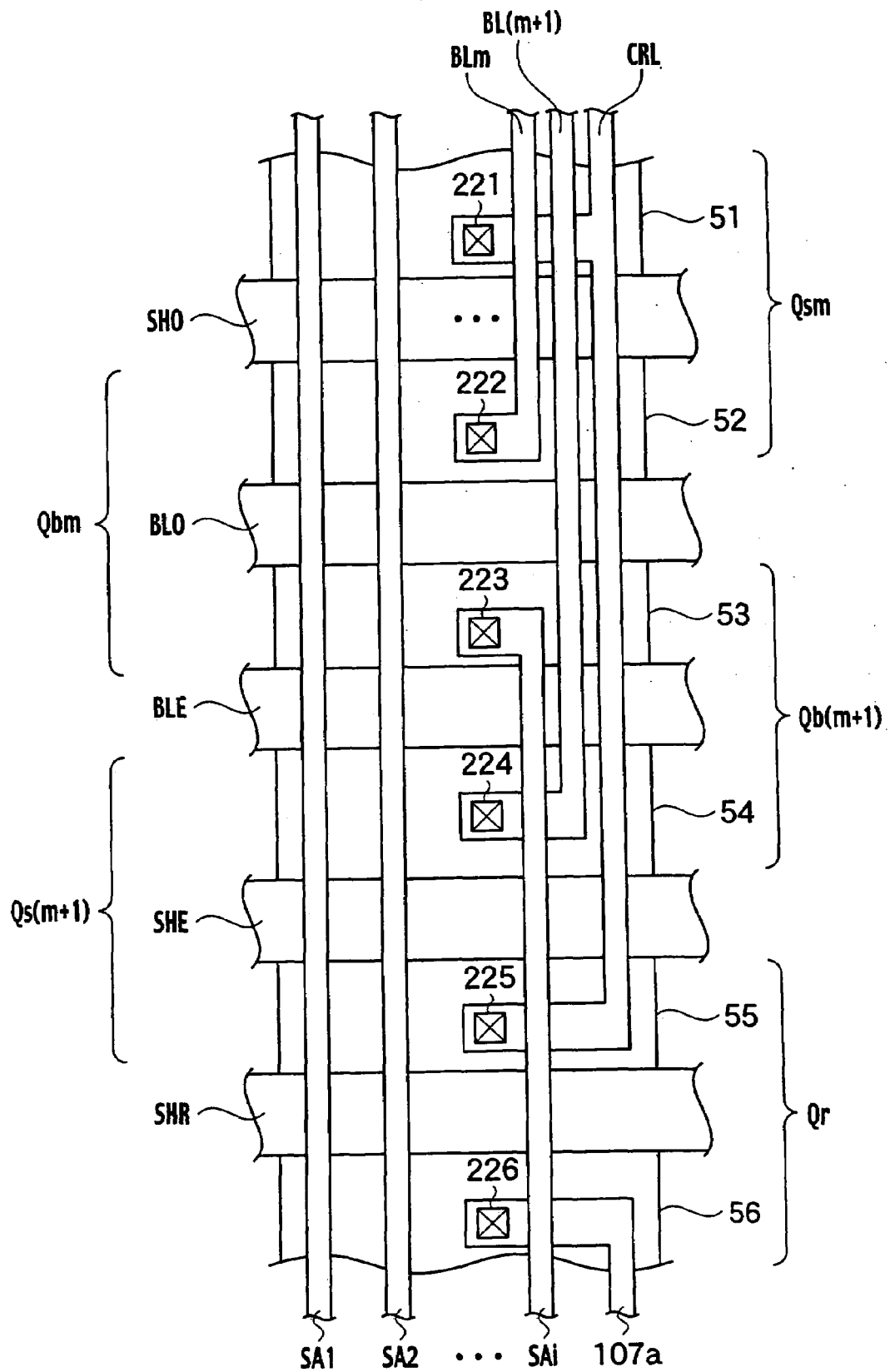
FIG. 10 is a plan view of the bit line selection circuit of the non-volatile semiconductor memory according to the first modification of the present invention.

As shown in FIG. 10, the odd shield transistor Qsm, the odd selection transistor Qbm, the even selection transistor Qb(m+1), the even shield transistor Qs(m+1) and the ground potential transistor Qr are arranged in series. The ground potential transistor Qr includes a source region 55, a drain region 56 disposed separately from the source region 55, a gate electrode SHR disposed on a channel region interposed between the source region 55 and the drain region 56. A shield node contact 225 is disposed on the source region 55. The shield node contact 225 is connected to the shield power supply 107 via the shield node CRL. A ground potential contact 226 is disposed on the drain region 56. The ground potential contact 226 is connected to the shield power supply 107 via the ground potential output node 107a. The ground potential output node 107a is wired to connect to the p-well as a back-gate potential of the ground potential transistor Qr, so that it is unnecessary to increase an amount of wiring.

Here, the source region 52 of the odd shield transistor Qsm is common to the source region 52 of the odd selection transistor Qbm. The drain region 53 of the odd selection transistor Qbm is common to the drain region 53 of the even selection transistor Qb(m+1). The source region 54 of the even selection transistor Qb(m+1) is common to the source region 54 of the even shield transistor Qs(m+1). Furthermore, the drain region 55 of the even shield transistor Qs(m+1) is common to the source region 55 of the ground potential transistor Qr.

The ground potential transistor Qr selects the bit line for shielding from among the bit lines BL1 to BL(m+1) so as to connect to the shield power supply 107 via the shield node CRL and the ground potential output node 107a, when the power source voltage VDD is applied to the gate electrode SHR in a reading operation. The shield power supply 107 supplies the ground potential GND.

In the non-volatile semiconductor memory shown in FIG. 3, variation circuits, which drive the row decoder 106 and the sense amplifier and latch circuit 103, are disposed in the driver 105 shown in FIG. 4. Furthermore, it is necessary to provide large-size transistors to drive the row decoder 106 and the sense amplifier and latch circuit 103, and wiring of the transistors is connected to the row decoder 106 and the sense amplifier and latch circuit 103, so that the wiring is clustered.

According to the first modification of the present invention, as shown in FIG. 10, since the source region 55 of the ground potential transistor Qr is disposed in the bit line selection circuit 102 so as to common to the drain region 55 of the ground potential transistor Qr, instead of that arrangement, the ground potential transistor Qr is disposed in the driver 105 shown in FIG. 4. Therefore, it is possible to reduce the size of the transistors, and to reduce the circuit area.

Furthermore, the ground potential transistor Qr may not share the source and drain regions with other transistor and is not a high voltage transistor. As the ground potential transistor Qr, a low voltage transistor may be disposed in a low voltage transistor area, in which the driver 105 is placed, or the like. As a result, it is possible to reduce the circuit area.

(Second Modification)

Figure 11:
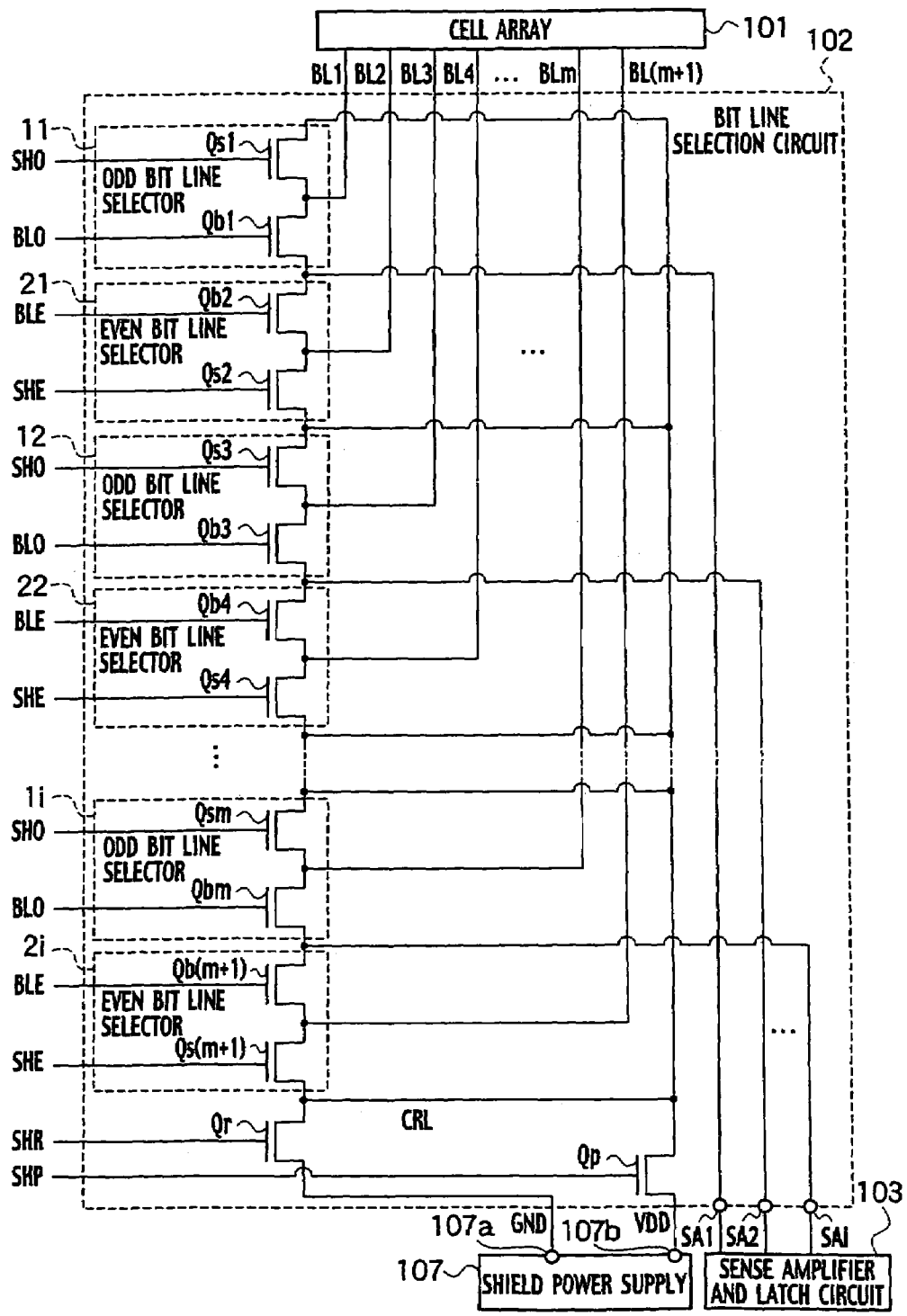
FIG. 11 is an equivalent circuit of a bit line selection circuit of a non-volatile semiconductor memory according to a second modification of the present invention.

As shown in FIG. 11, according to the second modification of the present invention, the non-volatile semiconductor memory is different from the bit line selection circuit 102 shown in FIG. 9 in that the bit line selection circuit 102 further includes a power supply voltage transistor Qp. A source region of the power supply voltage transistor Qp is connected to the drain region of the odd shield transistors Qs1, Qs3, . . . , Qsm and the even shield transistors Qs2, Qs4, . . . , Qs(m+1), and a source region of the ground potential transistor Qr. A drain region of the power supply voltage transistor Qp is connected to the power supply voltage output node 107b of the shield power supply 107.

Figure 12:
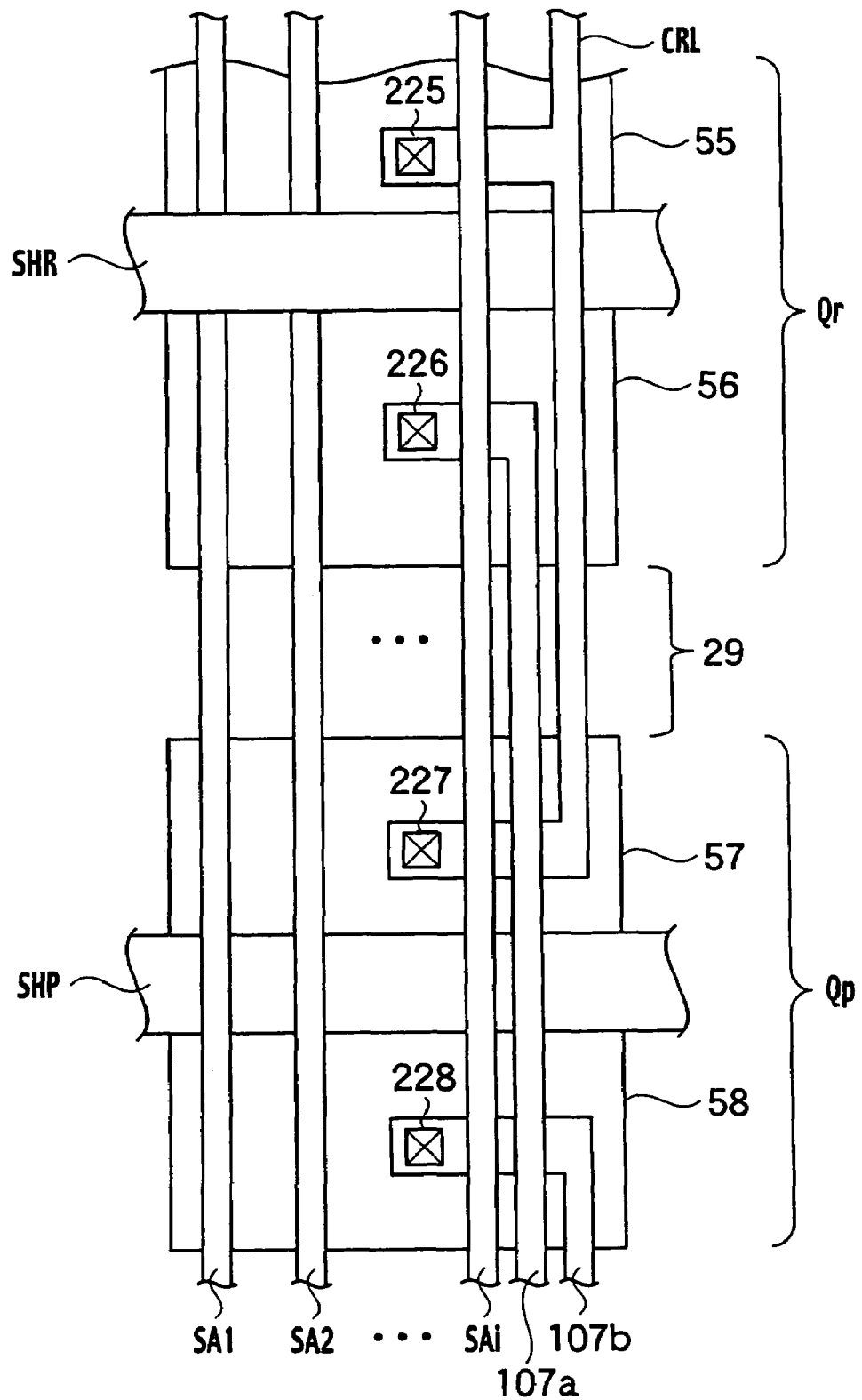
FIG. 12 is a plan view of the bit line selection circuit of the non-volatile semiconductor memory according to the second modification of the present invention.

As shown in FIG. 12, the power supply voltage transistor Qp is disposed in parallel to the ground potential transistor Qr via the element isolation area 29, as a high voltage transistor. The power supply voltage transistor Qp includes a source region 57 and a drain region 58 separated from the source region 57. A gate electrode SHP is disposed on a channel region which is interposed between the source region 57 and the drain region 58. A shield node contact 227 is disposed on the source region 57. The shield node contact 227 is connected to the shield power supply 107 via the power supply voltage output node 107b and the shield node CRL. A power supply voltage contact 228 is disposed on the drain region 58. The power supply voltage contact 228 is connected to the power supply voltage VDD.

In a writing operation, the power supply voltage transistor Qp selects a bit line to be shielded from among the bit lines BL1 to BL(m+1) so as to connect via the shield node CRL and the power supply voltage output node 107b to the shield power supply 107. When the power source voltage VDD is applied to the gate electrode SHP, the shield power supply 107 supplies the power supply voltage VDD.

According to the second modification of the present invention, the shield node CRL is a local wiring of the bit line selection circuit 102, so that wiring capacitance is decreased. As a result, it is possible to reduce the total size of transistors. Note that the power supply voltage transistor Qp may not be disposed in the bit line selection circuit 102. For example, the power supply voltage transistor Qp, which is a low voltage transistor having a narrower width than the width of a high voltage transistor, is disposed in a low voltage transistor area such as the driver 105 shown in FIG. 4 or the like. As a result, it is possible to reduce the circuit area.

(Third Modification)

Figure 13:
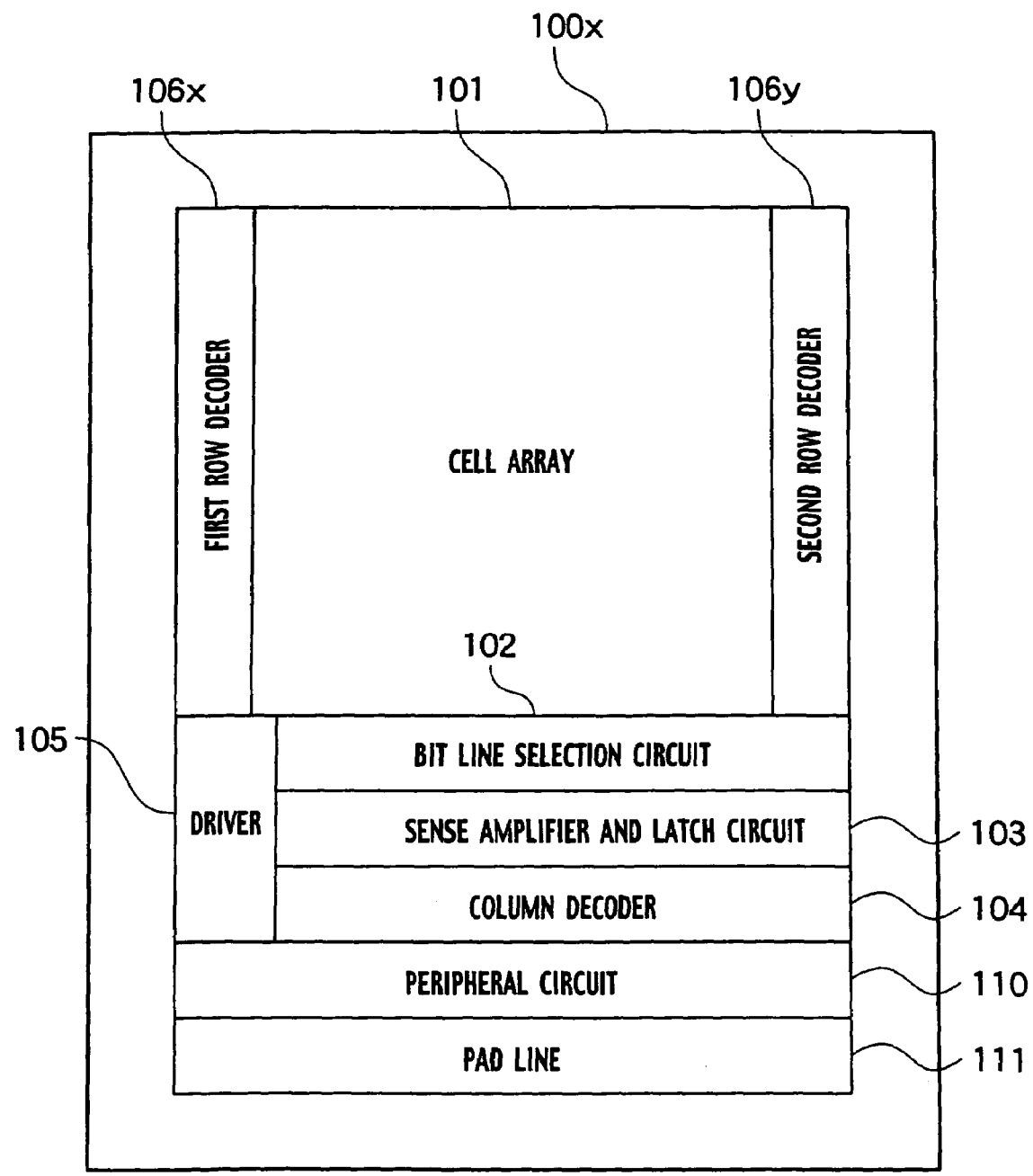
FIGS. 13 and 14 are plan views of non-volatile semiconductor memories according to a third modification of the present invention.

As shown in FIG. 13, in a non-volatile semiconductor memory according to the third modification of the present invention, a cell array 101 is disposed on a semiconductor chip 100x. A first and second row decoder 106x and 106y are disposed sandwiching the cell array 101 in the row direction. A bit line selection circuit 102, a sense amplifier and a latch circuit 103 and a column decoder 104 are disposed adjacent to the cell array 101 in the column direction. A driver 105 is disposed adjacent to the first row decoder 106x in the column direction, and adjoining each of the bit line selection circuit 102, the sense amplifier and latch circuit 103 and the column decoder 104 in the row direction. The driver 105 includes a shield power supply. A peripheral circuit 110 and a pad line 111 are disposed adjacent to the column decoder 104 and the driver 105 in the column direction.

The first row decoder 106x selects, for instance, a selection transistor in the cell array 101. The second row decoder 106y selects, for instance, a block and a word line in the cell array 101. The peripheral circuit 110 includes circuits for operation of the non-volatile semiconductor memory, such as the address buffer 109 and the I/O buffer 108 shown in FIG. 1 or the like. The pad line 111 includes a group of power supply voltage pads for providing the power supply voltage for operation of the non-volatile semiconductor memory including, for example, the ground potential transistor Qr shown in FIG. 9 or the like.

In the comparative example shown in FIG. 18, in the case where the pad lines are disposed at each of the sides of the cell array 201, the circuit area is increased. In the case where the pad line is disposed at one side of the cell array 201, for example the bit line selection circuit 202y side of the cell array 201, circuits which are need large driving force such as a ground potential transistor, a power supply voltage transistor are disposed in the first driver 205x. For this reason, the power supply voltage wiring is disposed from the pad line above the cell array 101 and the row decoder 106. Here, it is necessary to dispose the wiring widely, which is not necessary when two pad lines are provided, so as to have a low resistance for preventing noise. Furthermore, the wiring may be disposed outside of the cell array 101 and the row decoder 106. For this reason, the chip size is decreased.

By contrast, according to the third modification of the present invention, when the pad line 111 is disposed at one side of the cell array 101 as shown in FIG. 13, the ground potential transistor Qr and the power supply voltage transistor Qp which need a large driving voltage are disposed together on the side of the cell array 101. Therefore, wiring is not disposed above the cell array 101, so that it is possible to reduce the circuit area.

Figure 14:
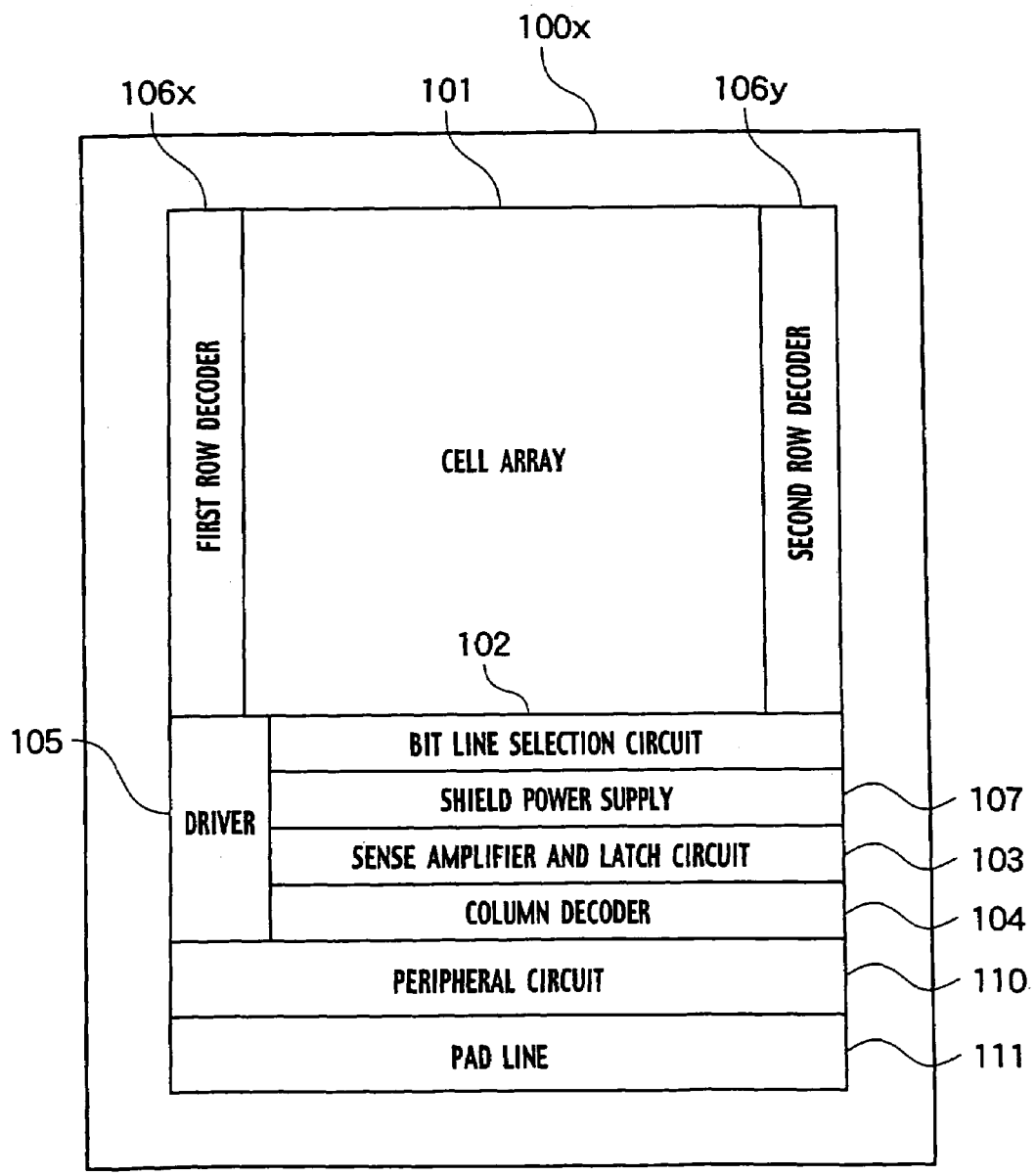

Furthermore, as shown in FIG. 14, the shield power supply 107 may be disposed separating from the driver 105. For example, the shield power supply 107 may be disposed between the bit line selection circuit 102, the sense amplifier and latch circuit 107.

(Fourth Modification)

Figure 15:
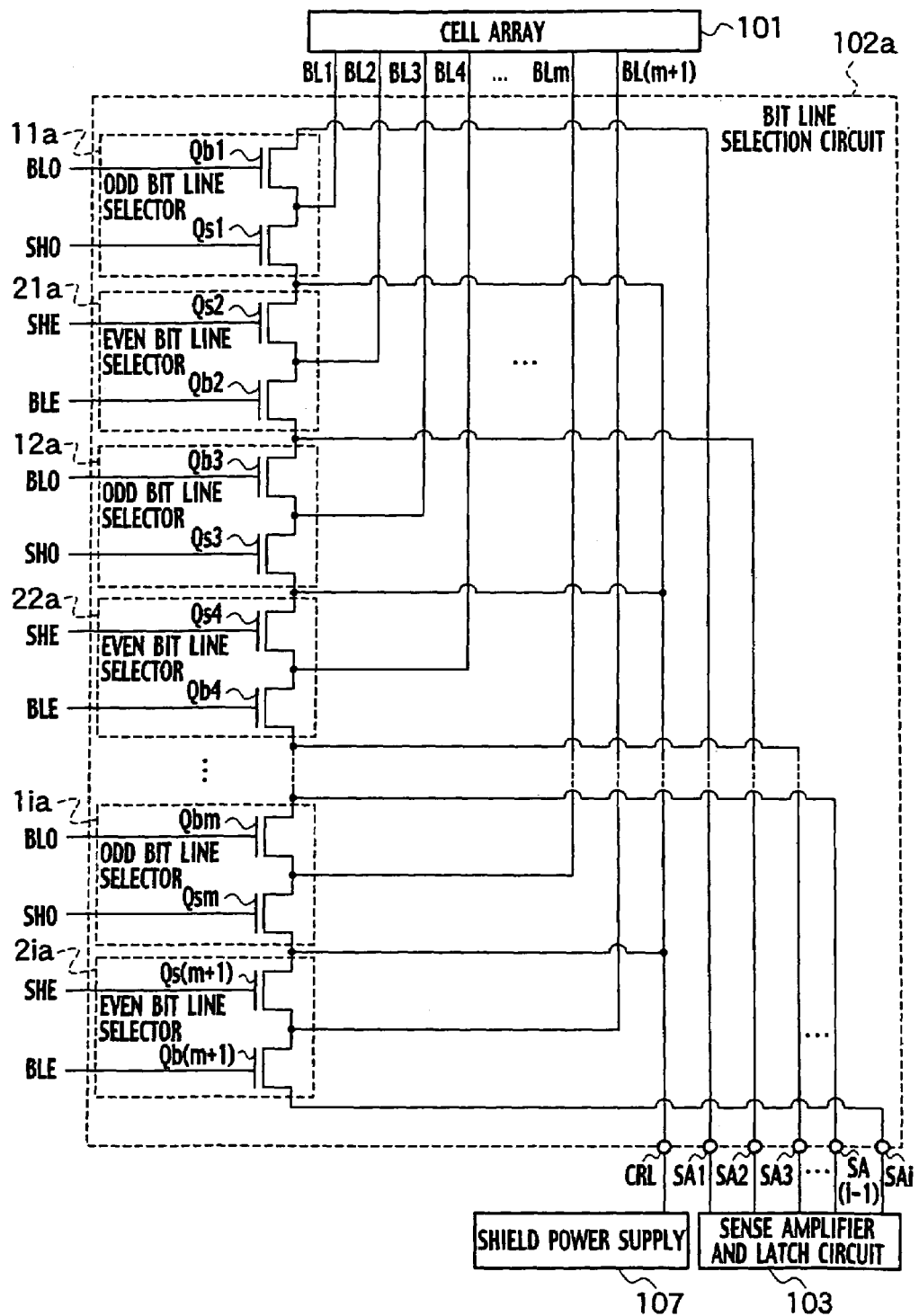
FIG. 15 is an equivalent circuit diagram of a bit line selection circuit of a non-volatile semiconductor memory according to a fourth modification of the present invention.

In the fourth modification of the present invention, the position of each of the odd shield transistors Qs1, Qs3, . . . , Qsm of the odd bit line selectors 11, 12, . . . , 1i shown in FIG. 3, and the position of the even shield transistors Qs2, Qs4, . . . , Qs(m+1) may be replaced with each other. Namely, as shown in FIG. 15, the bit line selection circuit 102a includes odd bit line selectors 11a, 12a, . . . , 1i and even bit line selectors 21a, 22a, . . . 2ia.

The odd bit line selector 11a includes an odd selection transistor Qb1 and an odd shield transistor Qs1. A source region of the odd selection transistor Qb1 is connected to the odd bit lines BL1, and a drain region of the odd selection transistor Qb1 is connected to the sense amplifier 103 via the sense amplifier node SA1. A source region of the odd shield transistor Qs1 is connected to the source region of the odd selection transistor Qb1, and a drain region of the odd shield transistor Qs1 is connected to the shield power supply 107 via the shield node CRL.

The even bit line selector 21a includes an even shield transistor Qs2 and an even selection transistor Qb2. A drain region of the even shield transistor Qs2 is connected to the drain region of the odd shield transistor Qs1, and a source region of the even shield transistor Qs2 is connected to the even bit lines BL2. A source region of the even selection transistor Qb2 is connected to the source region of the even shield transistor Qs2, and a drain region of the even selection transistor Qb2 is connected to the sense amplifier 103 via the sense amplifier node SA2.

Figure 16:
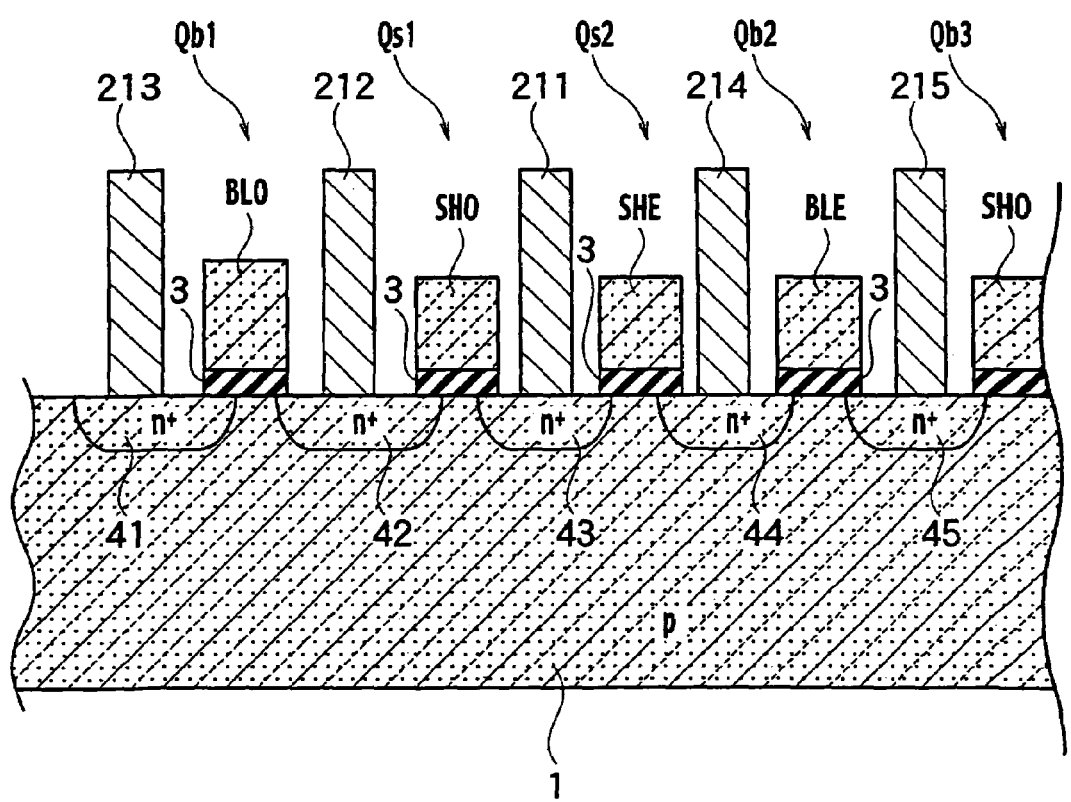
FIG. 16 is a cross-sectional view of the bit line selection circuit of the non-volatile semiconductor memory according to the fourth modification of the present invention.

Here, as shown in FIG. 16, the source region 42 of the odd selection transistor Qb1 and the source region 42 of the odd shield transistor Qs1 are common to each other. The drain region 43 of the odd shield transistor Qs1 and the drain region 43 of the even shield transistor Qs2 are common to each other. The source region 44 of the even shield transistor Qs2 and the source region 44 of the even selection transistor Qb2 are common to each other. The drain region 45 of the even selection transistor Qb2 and the drain region 45 of the odd selection transistor Qb3 of the odd bit line selectors 12a are common to each other.

Note that since the connection and the position of the odd bit line selectors 12a, . . . , 1ia and the even bit line selectors 22a, . . . 2ia are substantially the same as the connection and the position of the odd bit line selector 11a and the even bit line selector 21a, a redundant explanation will be omitted.

According to the fourth modification of the present invention, considering a design rule and effectiveness of patterns of prepherical circuits, the connection and the position of the odd shield transistors Qs1, Qs3, . . . , Qsm of the odd bit line selectors 11, 12, . . . , 1i shown in FIG. 3 may be changed to that of the even shield transistors Qs2, Qs4, . . . , Qs(m+1).

OTHER EMBODIMENTS

In the bit line selection circuit 102, the odd shield transistors Qs1, Qs3, . . . , Qs, and the even shield transistors Qs2, Qs4, . . . , Qs(m+1), the odd selection transistor Qb1, Qb3, . . . , Qbm and the even selection transistor Qb2, Qb4, . . . , Qb(m+1) respectively disposed in the row direction are described. In addition to, a plurality of shield transistors, which are similar to the odd shield transistors Qs1, Qs3, . . . , Qs, and the even shield transistors Qs2, Qs4, . . . , Qs(m+1), and selection transistors, which are similar to the odd selection transistor Qb1, Qb3, . . . , Qbm, and the even selection transistor Qb2, Qb4, . . . , Qb(m+1), may be arranged in a plurality of parallel in the row direction, in accordance with the number of cell units and bit lines of the cell array 101.

Various modifications will become possible for those skilled in the art after receiving the teachings of the present disclosure without departing from the scope thereof.

What is claimed is:

1. A non-volatile semiconductor memory comprising:
a cell array including a plurality of memory cells;
a plurality of bit lines extending in a column direction;
a sense amplifier configured to amplify data read out from the memory cells via the bit lines;
a shield power supply providing a voltage to shield the bit lines; and
a bit line selection circuit, configured to connect even bit lines to the shield power supply when odd bit lines are connected to the sense amplifier, and to connect the odd bit lines to the shield power supply when the even bit lines are connected to the sense amplifier; and
a pad line having a power supply pad disposed along the column direction so as to sandwich the bit line selection circuit between the cell array and the pad line.

2. The non-volatile semiconductor memory of claim 1, wherein the bit line selection circuit comprises:
an odd bit line selector connected between the odd bit line and the sense amplifier, and between the odd bit line and the shield power supply; and
an even bit line selector connected between the even bit line and the sense amplifier, and between the even bit line and the shield power supply.

3. The non-volatile semiconductor memory of claim 2, wherein the odd bit line selector comprises:
an odd shield transistor having a first main terminal region connected to the odd bit line, and having a second main terminal region connected to the shield power supply; and
an odd selection transistor having a first main terminal region connected to the first main terminal region of the odd shield transistor, and having a second main terminal region connected to the sense amplifier.

4. The non-volatile semiconductor memory of claim 3, wherein the even bit line selector comprises:

an even selection transistor having a first main terminal region connected to the even bit line, and having a second main terminal region connected to the second main terminal region of the odd selection transistor; and an even shield transistor having a first main terminal region connected to the first main terminal region of the even selection transistor, and having a second main terminal region connected to the shield power supply.

5. The non-volatile semiconductor memory of claim 3, wherein the first main terminal region of the odd shield transistor and the first main terminal region of the odd selection transistor share a common semiconductor region.

6. The non-volatile semiconductor memory of claim 4, wherein the second main terminal region of the odd selection transistor and the second main terminal region of the even selection transistor share a common semiconductor region.

7. The non-volatile semiconductor memory of claim 4, wherein the first main terminal region of the even selection transistor and the first main terminal region of the even shield transistor share a common semiconductor region.

8. The non-volatile semiconductor memory of claim 2, wherein the odd bit line selectors and the even bit line selectors are connected alternately.

9. The non-volatile semiconductor memory of claim 1, wherein the bit line selection circuit is disposed adjacent to the cell array in the column direction.

10. The non-volatile semiconductor memory of claim 1, further comprising a driver connected to the bit line selection circuit and driving the bit line selection circuit.

11. The non-volatile semiconductor memory of claim 10, wherein the driver is disposed adjacent to the bit line selection circuit in a row direction.

12. The non-volatile semiconductor memory of claim 4, wherein the bit line selection circuit further comprises a ground potential transistor configured to supply the ground potential from the shield power supply to the odd shield transistor and the even shield transistor.

13. The non-volatile semiconductor memory of claim 12, wherein the first main terminal region of the ground potential transistor is connected to the second main terminal region of the odd shield transistor and the even shield transistor, and the second main terminal region of the ground potential transistor is connected to a ground potential output node of the shield power supply.

14. The non-volatile semiconductor memory of claim 13, wherein the first main terminal region of the ground potential transistor shares a common semiconductor region with the second main terminal region of the even shield transistor.

15. The non-volatile semiconductor memory of claim 4, wherein the bit line selection circuit further comprises a power supply voltage transistor configured to provide the power supply voltage from the shield power supply to the odd shield transistor and the even shield transistor.

16. The non-volatile semiconductor memory of claim 15, wherein the first main terminal region of the power supply voltage transistor is connected to the second main terminal region of each of the odd shield transistor and the even shield transistor, and the second main terminal region of the power supply voltage transistor is connected to a power supply voltage output node.

17. The non-volatile semiconductor memory of claim 12, wherein the power supply pad supplies the power supply voltage of the ground potential transistor.

18. The non-volatile semiconductor memory of claim 3, wherein the even bit line selector comprises:

an even shield transistor having a first main terminal region connected to the even bit line, and having a second main terminal region connected to the second main terminal region of the odd shield transistor; and an even selection transistor having a first main terminal region connected to the first main terminal region of the even shield transistor, and having a second main terminal region connected to the sense amplifier.

19. The non-volatile semiconductor memory of claim 18, wherein the second main terminal region of the odd shield transistor shares a common semiconductor region with the second main terminal region of the even shield transistor.

20. The non-volatile semiconductor memory of claim 1, wherein the bit line selection circuit comprises:

an odd bit line selector configured to connect the odd bit line to the shield power supply when the even bit line is connected to the sense amplifier; and an even bit line selector configured to connect the even bit line to the shield power supply when the odd bit line is connected to the sense amplifier.

* * * * *